(12) United States Patent
Bechtolsheim

(10) Patent No.: US 7,791,894 B2
(45) Date of Patent: Sep. 7, 2010

(54) COMPACT RACKMOUNT STORAGE SERVER

(75) Inventor: Andreas V. Bechtolsheim, Palo Alto, CA (US)

(73) Assignee: Oracle America, Inc., Redwood City, CA (US)

( * ) Notice: Subject to any disclaimer, the term of this patent is extended or adjusted under 35 U.S.C. 154(b) by 0 days.

(21) Appl. No.: 12/101,805

(22) Filed: Apr. 11, 2008

(65) Prior Publication Data

US 2008/0212273 A1 Sep. 4, 2008

Related U.S. Application Data

(63) Continuation of application No. PCT/US2007/000905, filed on Jan. 12, 2007.

(60) Provisional application No. 60/759,155, filed on Jan. 13, 2006.

(51) Int. Cl.
*H05K 5/00* (2006.01)

(52) U.S. Cl. .................. 361/752; 361/800; 361/797

(58) Field of Classification Search .......... 361/752, 361/790, 797, 800, 760, 736, 748
See application file for complete search history.

(56) References Cited

U.S. PATENT DOCUMENTS

| | | | |
|---|---|---|---|
| 5,793,610 A * | 8/1998 | Schmitt et al. | 361/695 |
| 5,854,904 A | 12/1998 | Brown | |
| 5,971,804 A * | 10/1999 | Gallagher et al. | 439/581 |
| 6,115,250 A * | 9/2000 | Schmitt | 361/695 |
| 6,272,573 B1 * | 8/2001 | Coale et al. | 710/100 |
| 6,289,405 B1 * | 9/2001 | Movall et al. | 710/104 |
| 6,932,696 B2 * | 8/2005 | Schwartz et al. | 454/184 |
| 7,042,717 B2 * | 5/2006 | El-Batal et al. | 361/679.33 |
| 7,198,094 B2 * | 4/2007 | Barsun et al. | 165/80.3 |
| 7,312,999 B1 * | 12/2007 | Miyamura et al. | 361/724 |
| 7,359,186 B2 * | 4/2008 | Honda et al. | 361/679.33 |
| 7,369,406 B2 * | 5/2008 | Matsushima et al. | 361/695 |
| 7,415,115 B2 * | 8/2008 | Ma | 380/286 |
| 7,433,987 B2 * | 10/2008 | Freimark | 710/300 |
| 2005/0117310 A1 | 6/2005 | Miyamoto et al. | |
| 2005/0138258 A1 | 6/2005 | Seto | |
| 2005/0241810 A1 * | 11/2005 | Malone et al. | 165/122 |
| 2006/0061955 A1 * | 3/2006 | Imblum | 361/685 |
| 2008/0191590 A1 * | 8/2008 | Lin et al. | 312/223.2 |

OTHER PUBLICATIONS

PCT Notification of Transmittal of The International Search Report and The Written Opinion of The International Searching Authority, or The Declaration issued in International Application No. PCT/US07/00905 mailed on Feb. 25, 2008, 11 pages.

(Continued)

*Primary Examiner*—Hung S Bui
(74) *Attorney, Agent, or Firm*—Osah Liang LLP

(57) ABSTRACT

A rackmount storage server has a printed circuit board (PCB) having connectors for connecting with a plurality of top-loading storage devices. A controller assembly having a PCI expansion slot, is arranged to operatively connect to the passive backplane from a rear side of the PCB. Further, the rackmount storage server has redundant cooling unit for facilitating air flow in an interior region of the rackmount storage server. Further, the rackmount storage server may have an integrated battery for saving power for use in case of, for example, a power failure.

24 Claims, 9 Drawing Sheets

OTHER PUBLICATIONS

Hewlett Packard, "QuickSpace hp ProLiant DL580 Generation 2," DA-11372, Version 16, Nov. 20, 2002 [retrieved Sep. 16, 2007] Retrieved from the Internet <URL: http://www.dustin.se/DustinPictures/PDF/C/5010048694.pdf>, entire document (especially p. 1, 10, 23, 34).

International Business Machines, "IBM p5 595 Delivers 16-way to 64-way POWER 5 Processing to High-End Servers," IBM United States [retrieved Sep. 16, 2007] Retrieved from the Internet <URL:http//64.233.179.104/scholar?hl=en&lr=&q=cache: 6qQm4drE768J:www.datatrend.com/resources/pdf/p5_595. pdf+p5_595.pdf>, entire document (especially p. 1, 2, 8).

* cited by examiner

COMPACT RACKMOUNT STORAGE SERVER

BACKGROUND

As generally referred to in the art, a "server" is a computing device that is configured to perform operations for one or more other computing devices connected over a network. For an entity that requires computing infrastructure for handling relatively large amounts of network data, it is desirable to use servers that are designed to promote organizational/space efficiency and operational performance. In this regard, some servers are designed to be arranged in a "rack," whereby the rack (or "cabinet") houses numerous servers that are arranged, or "mounted," vertically one on top of another (however, not necessarily in contact with one another). Such a server is generally referred to in the art as a "rackmount" server.

Rackmount servers are generally designed having a height corresponding to whole multiples of an industry standard rack mounting height dimension. For example, rackmount servers are generally referred to as "2 U," "3 U," "4 U," etc. systems, where the "U" designation refers to one dimensional increment of 1.75 inches in height along the vertical members of an Electronics Industry Alliance (EIA) industry-standard computer racking/mounting structure. Thus, for example, a 2 U rackmount server is generally designed to be approximately 3.5 inches in height, less a small amount of clearance between vertically-adjacent rackmount servers in the rack (those skilled in the art will note that a standard rack is 19 inches wide; however, racks of other widths are available).

In view of size constraints and limitations of a rackmount server, it is important to combine and arrange components in the rackmount server in a manner that promotes operational performance and space efficiency.

SUMMARY

According to one aspect of one or more embodiments of the present invention, a server comprises: a printed circuit board (PCB) disposed along an inside surface of the server, where the PCB has a plurality of connectors adapted to be connected to a plurality of top-loading storage devices; and a controller assembly operatively connected to the PCB from a rear side of the PCB.

According to another aspect of one or more embodiments of the present invention, an apparatus comprises: a chassis; a PCB having a first connector connectable to a second connector integral with a hard disk insertable from a top portion of the chassis; and a controller assembly operatively connectable to a rear side of the PCB, the controller being accessible from a rear side of the chassis.

According to another aspect of one or more embodiments of the present invention, a rackmount storage server comprises: a passive backplane; top-loading hard disks each having a native connector pluggable into the passive backplane; and a controller operatively connected to the passive backplane from a rear side of the passive backplane.

Other aspects of the present invention will be apparent from the following description and the appended claims.

DETAILED DESCRIPTION

Figure 1:
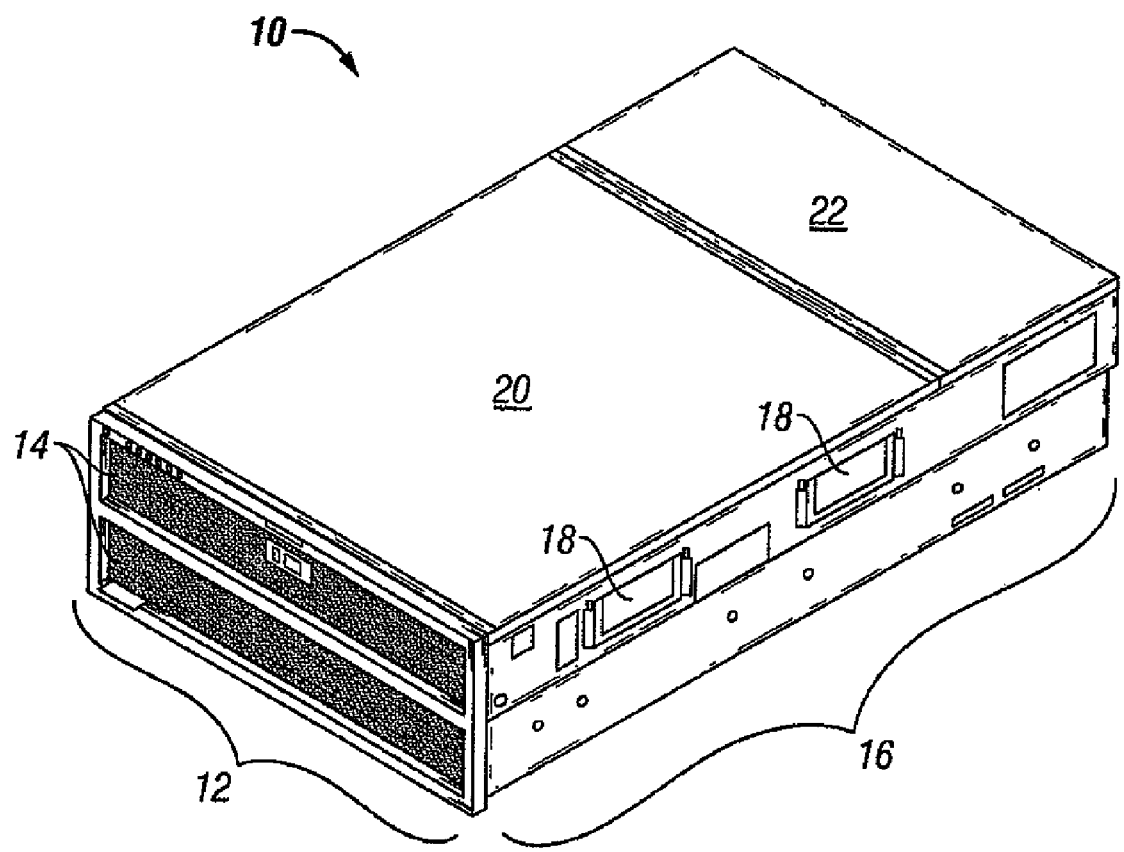
FIG. 1 shows a rackmount storage server in accordance with an embodiment of the present invention

Specific embodiments of the present invention will now be described in detail with reference to the accompanying figures. Like elements in the various figures are denoted by like reference numerals for consistency. Further, in the following detailed description of embodiments of the present invention, numerous specific details are set forth in order to provide a more thorough understanding of the present invention. In other instances, well-known features have not been described in detail to avoid obscuring the description of embodiments of the present invention.

Generally, embodiments of the present invention relate to a rackmount storage server having a novel combination and/or arrangement of components. FIG. 1 shows an example of a rackmount storage server 10 in accordance with an embodiment of the present invention. A front side 12 of the rackmount storage server 10 is formed of a vented surface 14 arranged to allow for the passage of air between a region interior to the rackmount storage sever 10 and a region exterior to the rackmount storage server 10. A right side 16 of the rackmount server 10 (and a left side of the rackmount server 10, the left side not being visible in FIG. 1) is formed of an attachment mechanism 18 for mounting the rackmount server 10 to a rack (or cabinet) (not shown) arranged to hold the rackmount server 10. Further, a first top cover 20 and a second top cover 22 may be used to enclose the rackmount server 10 from a top side, where the top side is defined as the side of the rackmount storage server 10 facing up when the rackmount storage server 10 is mounted in the rack (or cabinet) (not shown).

Figure 2:
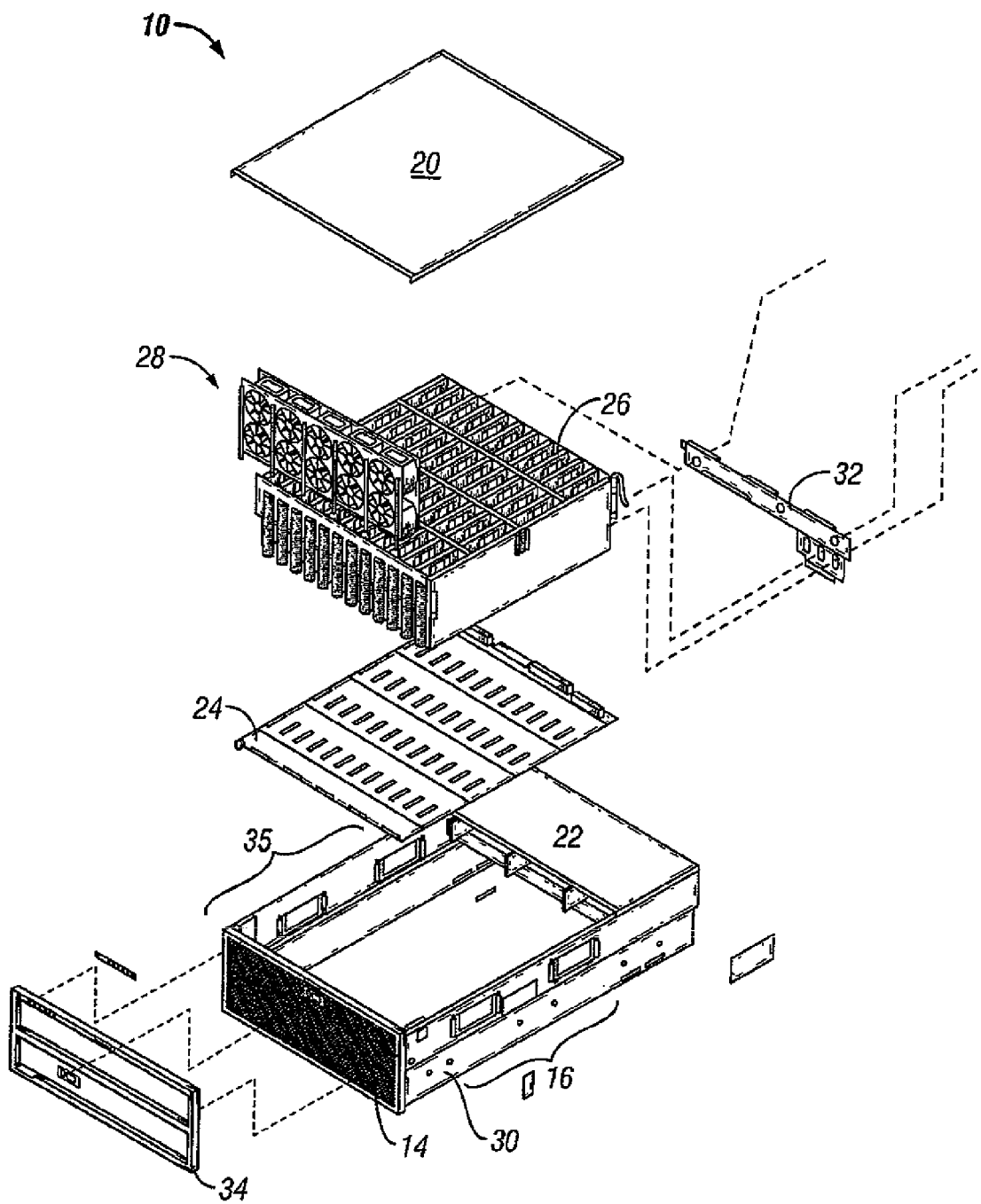
FIG. 2 shows an exploded perspective view of a rackmount storage server in accordance with an embodiment of the present invention.

FIG. 2 shows an exploded perspective view of a rackmount storage server 10 in accordance with an embodiment of the present invention. A chassis portion 30 of the rackmount storage server 10 is shown having left and right sides 35, 16 each having attachment mechanisms (shown, but not labeled) for mounting the rackmount storage server 10 to a rack (or cabinet) (not shown) arranged to hold the rackmount storage server 10. Further, a front side of the rackmount server 10 may be attached to a front member 34 as shown in FIG. 2.

A printed circuit board (PCB) 24, which may be a backplane (passive or active) or motherboard, is arranged to be fitted in the chassis portion 30. Particularly, the PCB 24 may be positioned along an inner bottom surface of the chassis portion 30. The PCB 24 has a plurality of connectors arranged to be connected to a plurality of storage devices (not shown), which may constitute hard disks, or other such devices that are used for the storage of data. Each of the plurality of storage devices (not shown) may have their own native connectors to connect with respective connectors disposed on the PCB 24.

As discernible in FIG. 2, the plurality of storage devices (not shown) may be loaded from a top side of the rackmount storage server 10. In other words, each of the plurality of storage devices (not shown) may be "plugged in" from the top of the rackmount storage server 10 to a connector on the PCB 24. Further, as shown in FIG. 2, a storage device housing (such as a disk carrier for enclosing hard disks) 26 is provided to individually and at least partially enclose/house each of the plurality of storage devices (not shown). In other words, the storage device housing 26 provides "slots" for inserting each of the plurality of storage devices (not shown).

In one or more embodiments of the present invention, one or more of the plurality of storage devices (not shown) may be serial ATA (SATA) disks. Further, in one or more embodiments of the present invention, one or more of the plurality of storage devices (not shown) may be serial attached SCSI (SAS) disks. Further, in one or more embodiments of the present invention, storage devices other than SATA and SAS disks may be used in the rackmount storage server 10.

Further, still referring to FIG. 2, those skilled in the art will note that, in one embodiment of the invention a total of 48 storage devices may be inserted in the rackmount storage server 10. The 48 storage devices may be arranged in 4 rows of 12 storage devices each as shown in FIG. 2. However, in one or more other embodiments of the present invention, a different number and/or different arrangement of storage devices may be used.

Along a front side of the rackmount storage server 10 are disposed a plurality of cooling devices 28. The cooling devices 28 in FIG. 2 are arranged as two rows of fans (further described below). The cooling devices 28 are arranged to provide redundant airflow through an overall region of the rackmount storage server 10. Those skilled in the art will note that in one or more embodiments of the present invention, a different number and/or different arrangement of cooling devices 28 (than that shown in FIG. 2) may be used.

Referring again to the PCB 24 shown in FIG. 2, the PCB 24 is arranged to be connected to an attachment means 32 for attaching the PCB 24 and the storage device housing 26.

Figure 3:
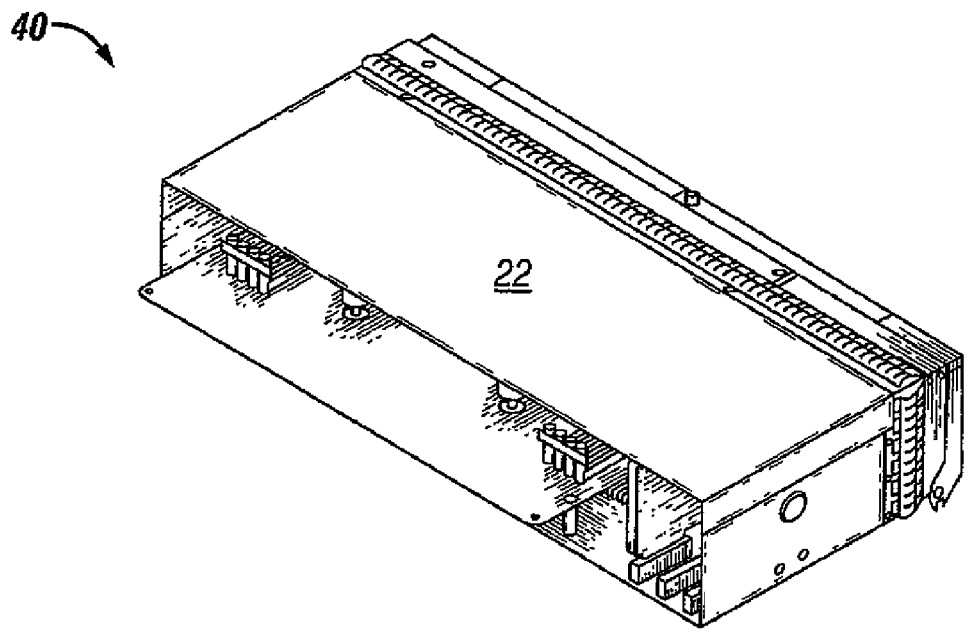
FIG. 3 shows a portion of a rackmount storage server in accordance with an embodiment of the present invention.

Further, top cover 22 is arranged to at least partially enclose/house a controller assembly as further described now with reference to FIG. 3. In FIG. 3, a controller assembly 40 is arranged to connect to the PCB 24 from a rear side of the PCB 24 as shown in FIG. 2. As discernible from FIGS. 2 and 3, the controller assembly 40 is arranged to be positioned in the rackmount storage server 10 from a rear side of the rackmount storage server 10. In one or more embodiments of the present invention, the controller assembly 40 may be arranged having general purpose server architecture capable of running one or more general purpose applications.

Further, in one or more embodiments of the present invention, the controller assembly 40 may be arranged to support peripheral component interconnect (PCI) (e.g., PCI-X, PCI-Express) expansion slots. Accordingly, the controller assembly 40 may be provided with PCI I/O connectivity from a rear side of the rackmount storage server 10.

Figure 4:
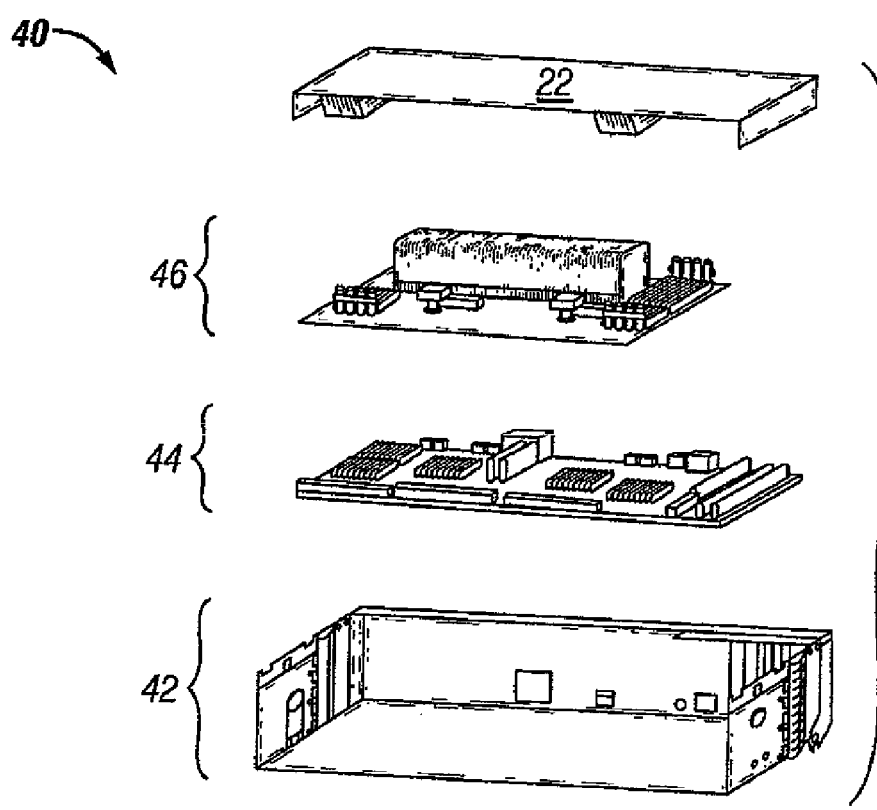
FIG. 4 shows an exploded perspective view of a portion of a rackmount storage server in accordance with an embodiment of the present invention.

FIG. 4 shows an exploded perspective view of a controller assembly 40 in accordance with an embodiment of the present invention. The controller assembly 40 contains a bottom chassis portion 42 in which a connector card 44 is arranged to be positioned. The connector card 44 may be arranged to connect to the PCB 24 shown in FIG. 2. Further, a CPU board assembly 46 may be positioned on the connector card 44 as shown in FIG. 4. The CPU assembly 46 may include processors, memory devices or other such components. Either of the connector card 44 or the CPU board assembly 46 may have slots (or connectors) (shown, but not labeled) for various components (e.g., memory modules, PCI cards, application specific cards, network cards).

Figure 5:
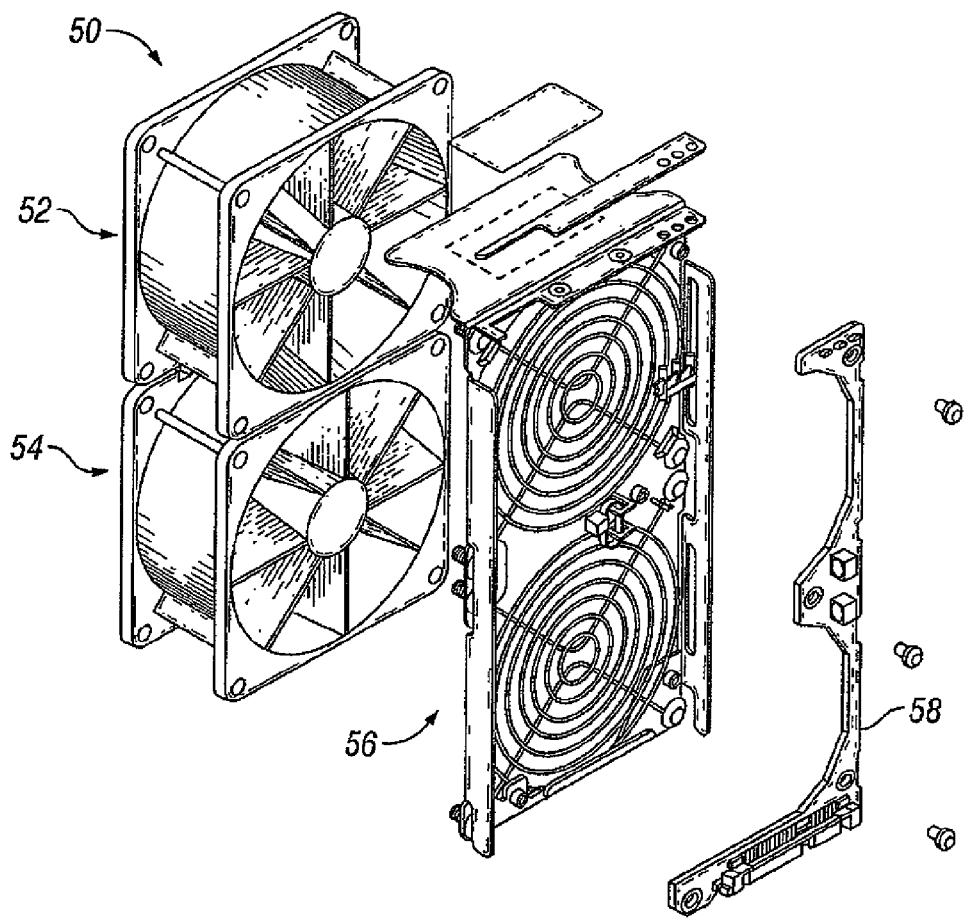
FIG. 5 shows an exploded perspective view of a portion of a rackmount storage server in accordance with an embodiment of the present invention.

Referring back to FIG. 2, cooling devices 28 are positioned in the rackmount storage server 10 to provide and facilitate airflow in the rackmount storage server 10. FIG. 5 shows an exploded perspective view of a module 50 forming the cooling devices 28. The cooling device module 50 is formed of two separate fan units 52, 54. The two fan units 52, 54 are arranged to direct air into the rackmount storage server 10. In other words, the two fan units 52, 54 are arranged to direct cool air from a region exterior of the rackmount storage server 10 into an interior region of the rackmount storage server 10. However, in one or more embodiments of the present invention, one or both of the fan units 52, 54 may be arranged to direct air out from the rackmount storage server 10. In this case, hot air from within an interior region of the rackmount storage server 10 is directed to a region exterior of the rackmount storage server 10. In one or more embodiments of the invention, at least one fan directs air from a region exterior into the rackmount storage server 10, while another fan directs air from the interior of the rackmount storage server 10 to an exterior region.

Still referring to FIG. 5, the two fan units 52, 54 may be attached to a singular fan unit cover piece 56. The singular fan unit cover piece 56 may be arranged to filter out large particles from entering an interior region of the rackmount storage server 10. Further, in one or more embodiments of the present invention, the singular fan unit cover piece 56 may be arranged to attract smaller dust particles so as to prevent such particles from entering an interior region of the rackmount storage server 10. Further, a bracket piece 58 may be used for attaching the singular fan unit cover piece 56 (and accordingly, the two fan units 52, 54) to a front portion (not shown in FIG. 5, but discernible in FIG. 2) of the rackmount storage server 10.

Further, in one or more embodiments of the present invention, a built-in or integrated UPS battery may be incorporated in the rackmount storage server 10. The built-in UPS battery may be arranged to allow the rackmount storage server 10 to save data in a main memory to one or more of a plurality of hard disks in the rackmount storage server 10 in the case, for example, of a power failure.

Advantages of the present invention may include one or more of the following. In one or more embodiments of the present invention, a rackmount storage server has a combination of storage devices, a PCB, and a controller assembly that promotes operational performance and/or space and cooling efficiency.

In one or more embodiments of the present invention, one or more storage devices may be "plugged in" from a top side of a rackmount storage server thereby possibly easing the insertion and connection of the hard disks into the rackmount storage server. Further, the storage devices are hot-swappable.

In one or more embodiments of the present invention, a controller assembly of a rackmount storage server may be arranged with PCI card expansion slots for improved and/or desirable I/O.

In one or more embodiments of the present invention, a relatively large number of top-loading hard disks, e.g., 48 top-loading hard disks, may be used to provide data storage in a rackmount storage server.

In one or more embodiments of the present invention, a rackmount storage server may use a plurality of redundant cooling units to facilitate air flow in the rackmount storage server.

In one or more embodiments of the present invention, a rackmount storage server may use a plurality of redundant cooling unit to facilitate airflow throughout an interior region of the rackmount storage server.

In one or more embodiments of the present invention, a controller of a rackmount storage server may have general purpose architecture to run one or more general purpose applications.

In one or more embodiments of the present invention, an integrated battery in a rackmount storage server may be used to save data from volatile memory (e.g., main memory) to non-volatile memory (e.g., a hard disk) in case of a power failure.

A detailed example of a rackmount storage server in accordance with the present invention is presented below in the form of a product specification. This specification describes the functionality, major components and subsystems, external interfaces, and operation of a server known as the Sun Fire X4500 available from Sun Microsystems, Inc.

With 48 500 GB hard drives, the Sun Fire x4500 system has raw storage capacity of 24 terabytes in 4 U. The Sun Fire x4500 system has two (2) PCI-X expansion slots. Two 10GigE NICs are installed into the slots. There are four (4) 1000BaseT links. The disk array is controlled by a 2-socket (dual-core capable) MP AMD Opteron™ processor subsystem.

An overview of supported Sun Fire x4500 features is shown in Table 1.

TABLE 1

Sun Fire x4500 Feature Summary

| Feature | Specification |
|---|---|
| Hard disks supported | 48 |
| Hard disk type | Serial-ATA I |
| Processor | AMD64 Opteron (1 MByte L2 cache per CPU chip) - dual core capable within power budget |
| Processor Configurations | Dual ONLY |
| Memory Type | PC3200 400 MHz Registered DIMMs with ECC PC2700 333 MHz Registered DIMMs with ECC |
| Memory Size | 4 DDR-I DIMM slots per processor |
| Memory Capacities | 512 MB, 1 GB, 2, or 4 GB per DIMM |
| Processor BIOS | STMicro 8 Mbit Flash with LPC Interface |
| Embedded Boot Device | Type-II Compact Flash slot (NOT hot-swappable) |
| Service Processor (SP) | Motorola PowerPC 8248 @ 266 MHz |
| SP Interface | 10/100BaseT Ethernet port, I²C connection to AMD8111, Serial port [serial port is multiplexed with the main serial port] |
| IO Ports | 10/100/1000BaseT Ethernet (RJ45 Connector) × 4 10/100BaseT Ethernet (RJ45 Connector) [for SP] RS-232 Serial Interface (RJ45 Connector) Four (4) USB 2.0 Ports (Type A Connector) (2x in front and 2x in rear) Video Port (VGA Connector) |

The Sun Fire x4500 includes an extensive set of RAS (Reliability, Availability, and Serviceability) Features, such as: hot-swappable and redundant fans and power supplies, remote lights-out server management, remote boot and remote software upgrades. The RAS feature also has Intelligent Systems Management including: SP (Service Processor), TPM (Trusted Platform Module), ECC Memory and Cache, and Predictive Failure Analysis, Hot-swap Fans, Hot-swap Power Supplies, Temperature and Voltage Monitoring, and KVM Redirection over Ethernet.

Figure 6:
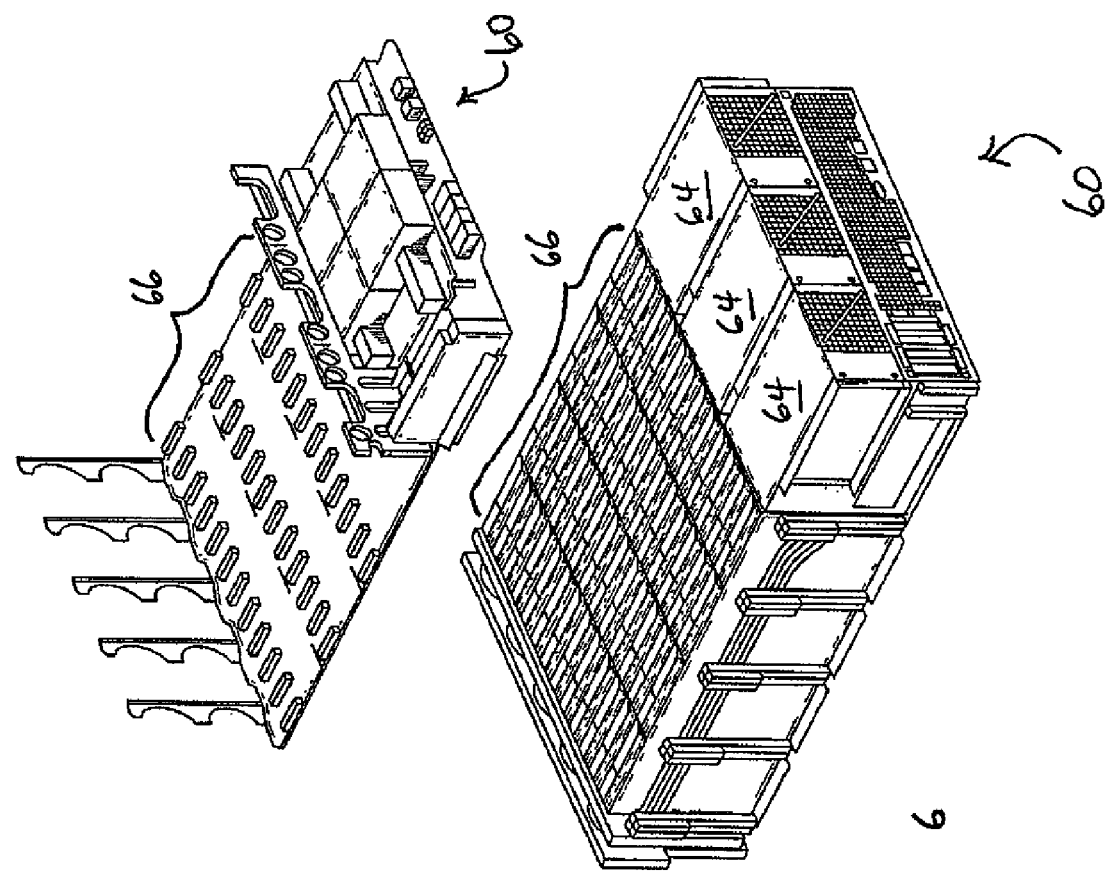
FIG. 6 shows a chassis mechanical drawing.
Figure 6:
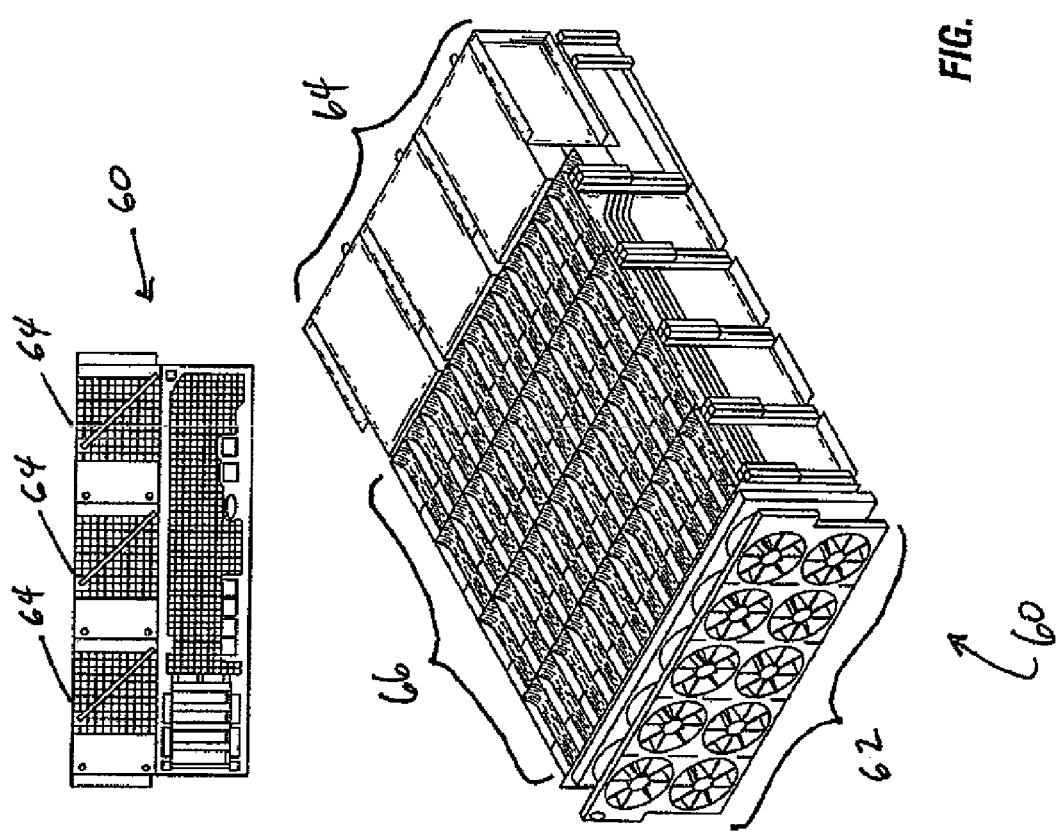

FIG. 6 illustrates the mechanical layout of the Sun Fire x4500, which is implemented in a custom 4 U rack-mountable chassis 60. The chassis 60 provides one controller FRU slot, one disk backplane, five fan trays 62, two power supplies in a 1+1 redundant configuration with an extra slot for a battery backup unit 64, and 48 disk slots 66. The five fan trays 62, each containing two individual fans, provide cooling for the system. In one embodiment, the fans can provide 300 CFM of airflow, from the front to the back of the chassis 60. The fan speed is variable, adjusting for the ambient conditions, the number of disks, and the system load. The system tolerates a single fan failure without compromising the cooling. Fan trays are hot-swappable. The power supplies may have additional fans to provide cooling during standby mode. Sun Fire x4500 provides module-level redundancy and hot-swappability for the power supplies and the hard drives. The Sun Fire x4500 provides the external interfaces described in Table 2.

TABLE 1

Sun Fire x4500 External Interfaces

| Type | Qty | Connector Type | Description |
|---|---|---|---|
| 133 MHz PCI-X Slots | 2 | 64-bit PCI-X | |
| 10/100/1000BaseT Ethernet | 4 | RJ45 | |
| 10/100BaseT Ethernet | 1 | RJ45 | Management port for SP |
| RS-232 serial port | 1 | RJ45 | Console port (multiplexed) |
| USB | 4 | USB Type A | 2x in front, 2x in rear |
| Compact Flash | 1 | 50-pin Type-II CF | Compact Flash for CPU file system |
| 220 V AC input | 3 | Standard IEC-320 connector | AC input located on power supply |

Figure 7:
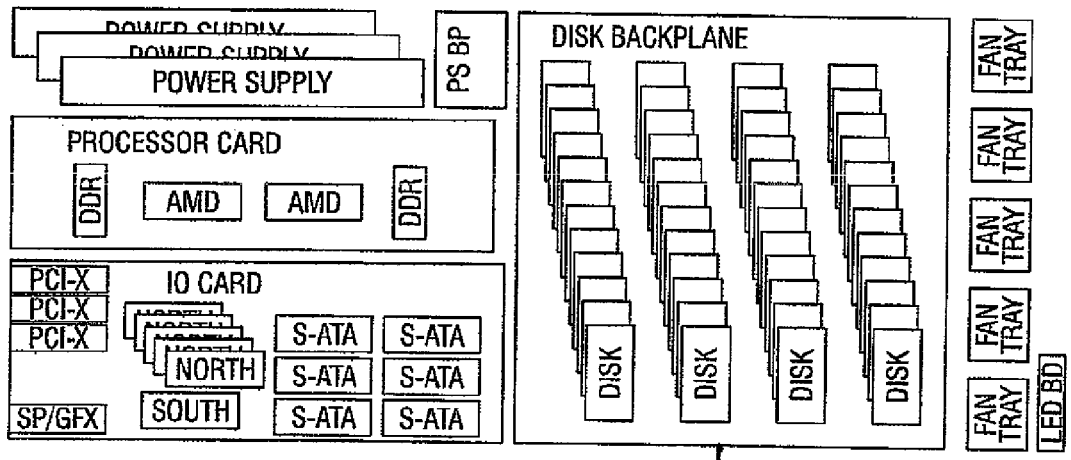
FIG. 7 shows two major components of an exemplary embodiment of a rackmount storage server.

Sun Fire x4500 consists of two major components as shown in FIG. 7. The first major component is the Controller Assembly 70, which contains the network interfaces, the processors, and the disk controllers, along with all management functionality. A Service Processor connected to the I/O Card monitors the status of the system and can be queried regardless of the state of rest of the system as long as there is standby power from one of the main supplies. The second major component of the system is the disk backplane 71, which contains the power and data connections for all of the hard drives, as well as the connections to the main power supplies, the battery backup unit, and fans. All of the hard drives are Serial ATA hard drives and support hot-swapping. The fan controller/driver resides on the Controller Assembly 70, but the tachometer signals are monitored on the disk backplane.

Figure 8:
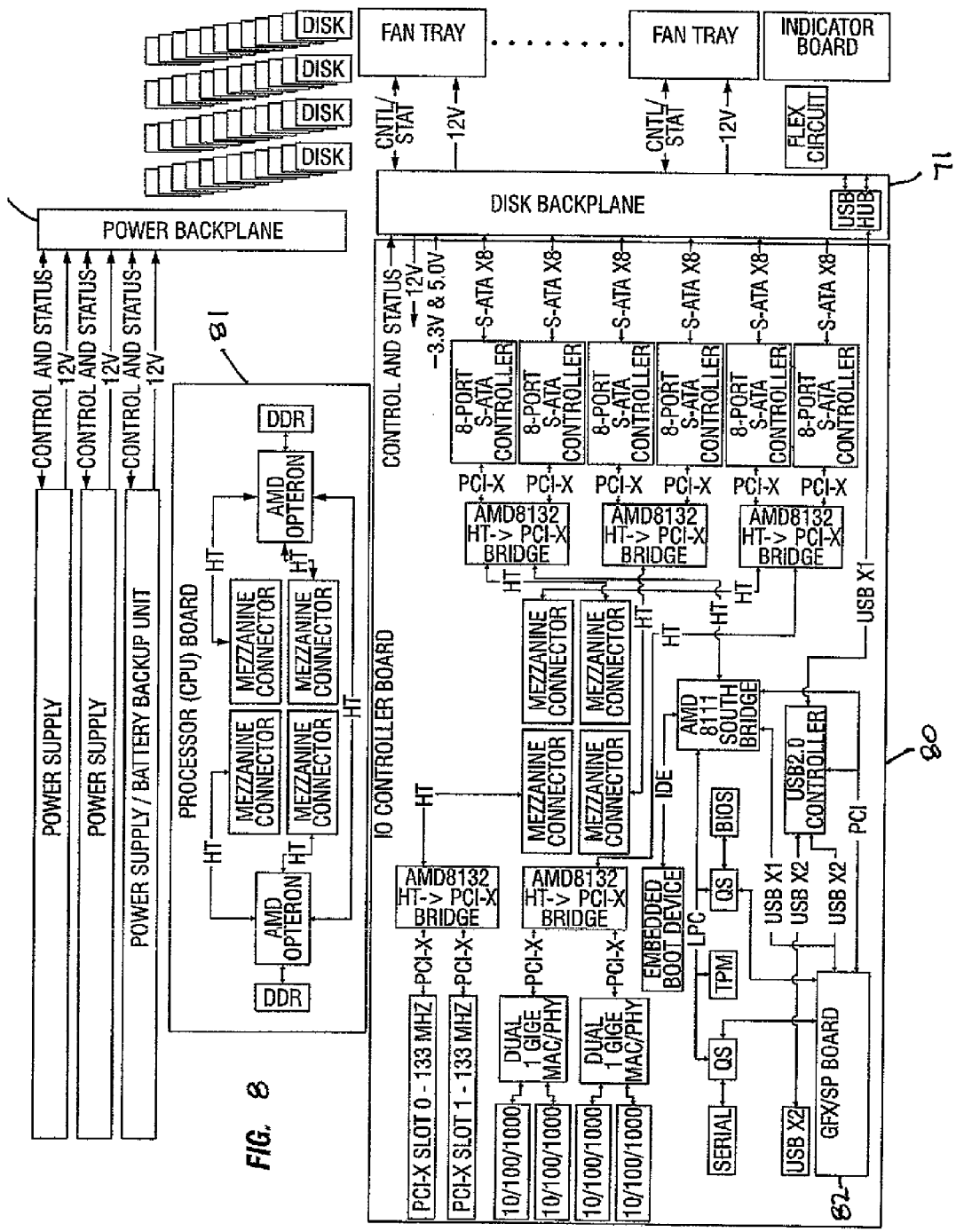
FIG. 8 shows a block diagram of an exemplary embodiment of a rackmount storage server.

A more detailed block diagram of the Sun Fire x4500 system is shown in FIG. 8. The Controller Assembly 70 includes an I/O-Board 80, a CPU-Board 81, a Graphics/SP-board 82, and a Service Processor 83. The I/O-board 80 contains the PCI-X Bridges, SouthBridge, S-ATA controllers and all I/O connectors. The CPU-board 81 contains the processors and the associated DDR DRAM memory. All of the control and datapath functionality, with the exception of the disks themselves, reside in the Controller Assembly 70. The Sun Fire x4500 includes two AMD Opteron™ processors, interconnected through AMD's HyperTransport technology. There are also HyperTransport links to PCI-X bridges and the AMD Southbridge, which connects to all standard I/O. All external connections, with the exception of power and the front USB ports, come into the Controller Assembly 70. In some cases, such as temperature, a separate interrupt immediately alerts the processors in case of a problem.

The Graphics/SP-board 82 plugs into a special slot on the I/O-board 80, and is connected to the Service Processor 83. The Service Processor (SP) 83 monitors the system and can report if there is a problem with the system, even if the main processors are not operating properly. The Service Processor 83 also monitors temperature and voltages, and has an RS-232 console port and an Ethernet management port for connectivity to the outside world. Service Processor 83 software detects fan failure, provides a front panel failure indication, generates a corresponding failure indication to the management system, and illuminates the individual fan failure LED indicator.

Figure 9:
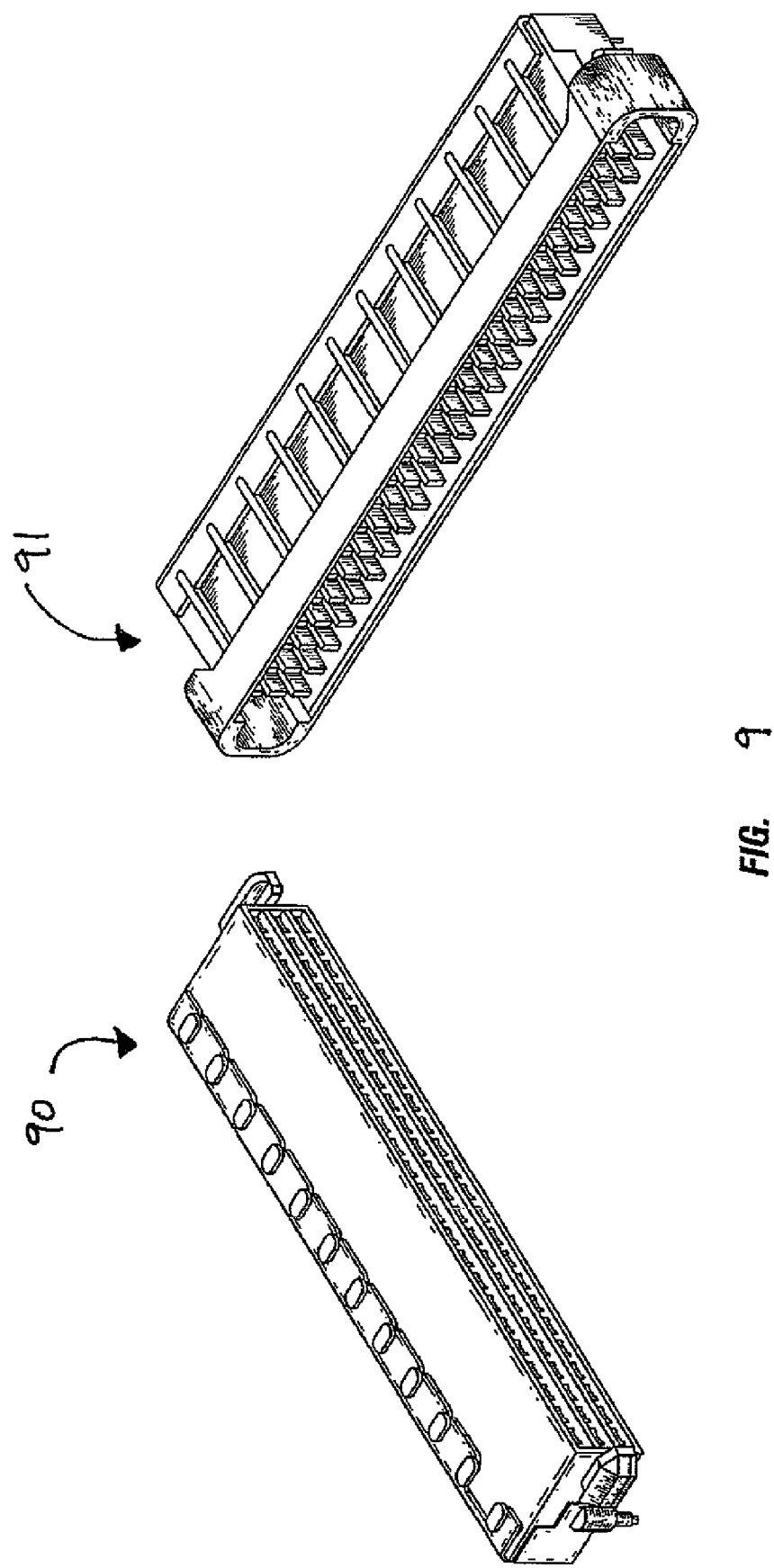
FIG. 9 shows two 144-circuit hi-speed dock connectors of an exemplary embodiment of a rackmount storage server.

As discussed above, the disk backplane 71 contains the power and data connections for all of the hard drives, as well as the connections to the main power supplies, the battery backup unit and fans. All of the hard drives are Serial ATA hard drives and are hot-swappable. The individual power supplies connect to the disk backplane 71 through a power backplane 84. The I/O-board 80 connects to the disk backplane 71 through a combination of a Molex hi-speed dock connector and a PowerBlade connector. For all differential pairs, and for some of the single-ended control signals, two 144-circuit hi-speed dock connectors 90, 91 as shown in FIG. 9 are used. The fixed connector 90 is mounted on the disk backplane 71. The mating floating connector 91 is mounted on the I/O controller card 80. The I/O card 80 to disk backplane 71 connector pin-outs are set forth below in Tables 3 and 4.

TABLE 3

I/O Card to Disk Backplane Molex Hi-Speed Dock Connector Pin-out

| Pin # | Pin Name |
|---|---|
| A1 | FRONT_USB_P |
| A2 | FRONT_USB_N |
| A3 | 5V_AUX |
| A4 | PS2_BATT_L |
| A5 | DISK36_TX_P |
| A6 | DISK36_TX_N |
| A7 | DISK24_RX_N |
| A8 | DISK24_RX_P |
| A9 | DISK36_ACT_LED_L |
| A10 | DISK13_ACT_LED_L |

TABLE 3-continued

I/O Card to Disk Backplane Molex Hi-Speed Dock Connector Pin-out

| Pin # | Pin Name |
|---|---|
| A11 | DISK0_TX_P |
| A12 | DISK0_TX_N |
| A13 | DISK1_TX_N |
| A14 | DISK1_TX_P |
| A15 | DISK25_RX_P |
| A16 | DISK25_RX_N |
| A17 | DISK37_TX_N |
| A18 | DISK37_TX_P |
| A19 | DISK25_ACT_LED_L |
| A20 | DISK38_ACT_LED_L |
| A21 | DISK14_RX_P |
| A22 | DISK14_RX_N |
| A23 | DISK26_TX_N |
| A24 | DISK26_TX_P |
| A25 | DISK3_RX_P |
| A26 | DISK3_RX_N |
| A27 | DISK15_TX_N |
| A28 | DISK15_TX_P |
| A29 | DISK3_ACT_LED_L |
| A30 | DISK16_ACT_LED_L |
| A31 | DISK39_RX_P |
| A32 | DISK39_RX_N |
| A33 | DISK4_TX_N |
| A34 | DISK4_TX_P |
| A35 | DISK28_RX_P |
| A36 | DISK28_RX_N |
| A37 | DISK40_TX_N |
| A38 | DISK40_TX_P |
| A39 | DISK28_ACT_LED_L |
| A40 | DISK41_ACT_LED_L |
| A41 | DISK17_RX_P |
| A42 | DISK17_RX_N |
| A43 | DISK29_TX_N |
| A44 | DISK29_TX_P |
| A45 | 3_3AUX_IN |
| A46 | GND |
| A47 | 3_3_AUX_SENSE_P |
| A48 | 3_3_AUX_SENSE_N |
| B1 | SHORT_PIN1 |
| B2 | P3_3V |
| B3 | 5V_AUX |
| B4 | GND |
| B5 | DISK36_RX_N |
| B6 | DISK36_RX_P |
| B7 | DISK12_TX_P |
| B8 | DISK12_TX_N |
| B9 | DISK24_ACT_LED_L |
| B10 | DISK1_ACT_LED_L |
| B11 | DISK0_RX_N |
| B12 | DISK0_RX_P |
| B13 | DISK13_RX_P |
| B14 | DISK13_RX_N |
| B15 | DISK25_TX_N |
| B16 | DISK25_TX_P |
| B17 | DISK2_RX_P |
| B18 | DISK2_RX_N |
| B19 | DISK37_ACT_LED_L |
| B20 | DISK26_ACT_LED_L |
| B21 | DISK14_TX_N |
| B22 | DISK14_TX_P |
| B23 | DISK38_RX_P |
| B24 | DISK38_RX_N |
| B25 | DISK3_TX_N |
| B26 | DISK3_TX_P |
| B27 | DISK27_RX_P |
| B28 | DISK27_RX_N |
| B29 | DISK15_ACT_LED_L |
| B30 | DISK4_ACT_LED_L |
| B31 | DISK39_TX_N |
| B32 | DISK39_TX_P |
| B33 | DISK16_RX_P |
| B34 | DISK16_RX_N |
| B35 | DISK28_TX_N |

TABLE 3-continued

I/O Card to Disk Backplane Molex Hi-Speed Dock Connector Pin-out

| Pin # | Pin Name |
|---|---|
| B36 | DISK28_TX_P |
| B37 | DISK5_RX_P |
| B38 | DISK5_RX_N |
| B39 | DISK40_ACT_LED_L |
| B40 | DISK29_ACT_LED_L |
| B41 | DISK17_TX_N |
| B42 | DISK17_TX_P |
| B43 | DISK41_RX_P |
| B44 | DISK41_RX_N |
| B45 | 3_3AUX_IN |
| B46 | 5V_DISK_SENSE_N |
| B47 | 5V_DISK_SENSE_P |
| B48 | MAMMOTH_INT_L |
| C1 | POWER_BUTTON_L |
| C2 | LOCATE_BUTTON_L |
| C3 | P5V |
| C4 | GND |
| C5 | DISK24_TX_P |
| C6 | DISK24_TX_N |
| C7 | DISK12_RX_N |
| C8 | DISK12_RX_P |
| C9 | DISK12_ACT_LED_L |
| C10 | DISK0_ACT_LED_L |
| C11 | DISK1_RX_P |
| C12 | DISK1_RX_N |
| C13 | DISK13_TX_N |
| C14 | DISK13_TX_P |
| C15 | DISK37_RX_P |
| C16 | DISK37_RX_N |
| C17 | DISK2_TX_N |
| C18 | DISK2_TX_P |
| C19 | DISK2_ACT_LED_L |
| C20 | DISK14_ACT_LED_L |
| C21 | DISK26_RX_P |
| C22 | DISK26_RX_N |
| C23 | DISK38_TX_N |
| C24 | DISK38_TX_P |
| C25 | DISK15_RX_P |
| C26 | DISK15_RX_N |
| C27 | DISK27_TX_N |
| C28 | DISK27_TX_P |
| C29 | DISK27_ACT_LED_L |
| C30 | DISK39_ACT_LED_L |
| C31 | DISK4_RX_P |
| C32 | DISK4_RX_N |
| C33 | DISK16_TX_N |
| C34 | DISK16_TX_P |
| C35 | DISK40_RX_P |
| C36 | DISK40_RX_N |
| C37 | DISK5_TX_N |
| C38 | DISK5_TX_P |
| C39 | DISK5_ACT_LED_L |
| C40 | DISK17_ACT_LED_L |
| C41 | DISK29_RX_P |
| C42 | DISK29_RX_N |
| C43 | DISK41_TX_N |
| C44 | DISK41_TX_P |
| C45 | 3_3AUX_IN |
| C46 | GND |
| C47 | SP_I2C_CLK |
| C48 | SP_I2C_DAT |

TABLE 4

I/O Card to Disk Backplane Molex Hi-Speed Dock Connector Pin-out

| Pin # | Pin Name |
|---|---|
| A1 | 12V_SENSE_P |
| A2 | 12V_SENSE_N |

TABLE 4-continued

I/O Card to Disk Backplane Molex Hi-Speed Dock Connector Pin-out

| Pin # | Pin Name |
|---|---|
| A3 | DISK6_RX_P |
| A4 | DISK6_RX_N |
| A5 | DISK18_TX_N |
| A6 | DISK18_TX_P |
| A7 | DISK6_ACT_LED_L |
| A8 | DISK19_ACT_LED_L |
| A9 | DISK42_RX_P |
| A10 | DISK42_RX_N |
| A11 | DISK7_TX_N |
| A12 | DISK7_TX_P |
| A13 | DISK31_RX_P |
| A14 | DISK31_RX_N |
| A15 | DISK43_TX_N |
| A16 | DISK43_TX_P |
| A17 | DISK31_ACT_LED_L |
| A18 | DISK44_ACT_LED_L |
| A19 | DISK20_RX_P |
| A20 | DISK20_RX_N |
| A21 | DISK32_TX_N |
| A22 | DISK32_TX_P |
| A23 | DISK9_RX_P |
| A24 | DISK9_RX_N |
| A25 | DISK21_TX_N |
| A26 | DISK21_TX_P |
| A27 | DISK9_ACT_LED_L |
| A28 | DISK22_ACT_LED_L |
| A29 | DISK45_RX_P |
| A30 | DISK45_RX_N |
| A31 | DISK10_TX_N |
| A32 | DISK10_TX_P |
| A33 | DISK34_RX_P |
| A34 | DISK34_RX_N |
| A35 | DISK46_TX_N |
| A36 | DISK46_TX_P |
| A37 | DISK34_ACT_LED_L |
| A38 | DISK47_ACT_LED_L |
| A39 | DISK23_RX_P |
| A40 | DISK23_RX_N |
| A41 | DISK35_TX_N |
| A42 | DISK35_TX_P |
| A43 | PS0_FAN_FAIL_L |
| A44 | PS1_FAN_FAIL_L |
| A45 | PS2_FAN_FAIL_L |
| A46 | PS0_VIN_GOOD_L |
| A47 | PS1_VIN_GOOD_L |
| A48 | PS2_ENABLE_L |
| B1 | 3_3AUX_POWERGOOD |
| B2 | PS1_ENABLE_L |
| B3 | DISK6_TX_N |
| B4 | DISK6_TX_P |
| B5 | DISK30_RX_P |
| B6 | DISK30_RX_N |
| B7 | DISK18_ACT_LED_L |
| B8 | DISK7_ACT_LED_L |
| B9 | DISK42_TX_N |
| B10 | DISK42_TX_P |
| B11 | DISK19_RX_P |
| B12 | DISK19_RX_N |
| B13 | DISK31_TX_N |
| B14 | DISK31_TX_P |
| B15 | DISK8_RX_P |
| B16 | DISK8_RX_N |
| B17 | DISK43_ACT_LED_L |
| B18 | DISK32_ACT_LED_L |
| B19 | DISK20_TX_N |
| B20 | DISK20_TX_P |
| B21 | DISK44_RX_P |
| B22 | DISK44_RX_N |
| B23 | DISK9_TX_N |
| B24 | DISK9_TX_P |
| B25 | DISK33_RX_P |

TABLE 4-continued

I/O Card to Disk Backplane Molex Hi-Speed Dock Connector Pin-out

| Pin # | Pin Name |
|---|---|
| B26 | DISK33_RX_N |
| B27 | DISK21_ACT_LED_L |
| B28 | DISK10_ACT_LED_L |
| B29 | DISK45_TX_N |
| B30 | DISK45_TX_P |
| B31 | DISK22_RX_P |
| B32 | DISK22_RX_N |
| B33 | DISK34_TX_N |
| B34 | DISK34_TX_P |
| B35 | DISK11_RX_P |
| B36 | DISK11_RX_N |
| B37 | DISK46_ACT_LED_L |
| B38 | DISK35_ACT_LED_L |
| B39 | DISK23_TX_N |
| B40 | DISK23_TX_P |
| B41 | DISK47_RX_P |
| B42 | DISK47_RX_N |
| B43 | PS0_POWEROK |
| B44 | PS0_PRESENT_L |
| B45 | PS1_PRESENT_L |
| B46 | PS2_PRESENT_L |
| B47 | PS2_VIN_GOOD_L |
| B48 | SHORT_PIN4 |
| C1 | VDD_RTC |
| C2 | PS0_ENABLE_L |
| C3 | DISK18_RX_P |
| C4 | DISK18_RX_N |
| C5 | DISK30_TX_N |
| C6 | DISK30_TX_P |
| C7 | DISK30_ACT_LED_L |
| C8 | DISK42_ACT_LED_L |
| C9 | DISK7_RX_P |
| C10 | DISK7_RX_N |
| C11 | DISK19_TX_N |
| C12 | DISK19_TX_P |
| C13 | DISK43_RX_P |
| C14 | DISK43_RX_N |
| C15 | DISK8_TX_N |
| C16 | DISK8_TX_P |
| C17 | DISK8_ACT_LED_L |
| C18 | DISK20_ACT_LED_L |
| C19 | DISK32_RX_P |
| C20 | DISK32_RX_N |
| C21 | DISK44_TX_N |
| C22 | DISK44_TX_P |
| C23 | DISK21_RX_P |
| C24 | DISK21_RX_N |
| C25 | DISK33_TX_N |
| C26 | DISK33_TX_P |
| C27 | DISK33_ACT_LED_L |
| C28 | DISK45_ACT_LED_L |
| C29 | DISK10_RX_P |
| C30 | DISK10_RX_N |
| C31 | DISK22_TX_N |
| C32 | DISK22_TX_P |
| C33 | DISK46_RX_P |
| C34 | DISK46_RX_N |
| C35 | DISK11_TX_N |
| C36 | DISK11_TX_P |
| C37 | DISK11_ACT_LED_L |
| C38 | DISK23_ACT_LED_L |
| C39 | DISK35_RX_P |
| C40 | DISK35_RX_N |
| C41 | DISK47_TX_N |
| C42 | DISK47_TX_P |
| C43 | PS1_POWEROK |
| C44 | PS2_POWEROK |
| C45 | PS0_FAIL |
| C46 | PS1_FAIL |
| C47 | PS2_FAIL |
| C48 | INTRUSION_SW |

The I/O Card to disk backplane PowerBlade connector pin-out is set forth below in Table 5. The connector has 10 blades with a 30 A limit per blade. There are 20 signals pins. Three blades are used for 12V, giving a 90 A capability. Two blades are used for 5V, resulting in a 60 A capability.

TABLE 5

I/O Card to Disk Backplane PowerBlade Connector Pin-out

| Pin # | Pin Name | Pin # | Pin Name | Pin # | Pin Name | Pin # | Pin Name |
|---|---|---|---|---|---|---|---|
| | | | Blade 1 | | | | 5V_DISK |
| | | | Blade 2 | | | | 5V_DISK |
| | | | Blade 3 | | | | GND |
| | | | Blade 4 | | | | GND |
| | | | Blade 5 | | | | GND |
| A1 | FAN4_CTL0 | B1 | FAN4_CTL0 | C1 | FAN4_CTL1 | D1 | FAN4_CTL1 |
| A2 | FAN3_CTL0 | B2 | FAN3_CTL0 | C2 | FAN3_CTL1 | D2 | FAN3_CTL1 |
| A3 | FAN2_CTL0 | B3 | FAN2_CTL0 | C3 | FAN2_CTL1 | D3 | FAN2_CTL1 |
| A4 | FAN1_CTL0 | B4 | FAN1_CTL0 | C4 | FAN1_CTL1 | D4 | FAN1_CTL1 |
| A5 | FAN0_CTL0 | B5 | FAN0_CTL0 | C5 | FAN0_CTL1 | D5 | FAN0_CTL1 |
| | | | Blade 6 | | | | +12 V |
| | | | Blade 7 | | | | GND |
| | | | Blade 8 | | | | +12 V |
| | | | Blade 9 | | | | GND |
| | | | Blade 10 | | | | +12 V |

The Mezzanine Connector Pin-outs are set forth below in Tables 6-9.

TABLE 6

I/O Card to Processor Card Mezzanine Connector Pin-out

| Pin # | Pin Name |
|---|---|
| 1 | PROC0_PCIX0_HTDATA0_P |
| 2 | PROC0_PCIX0_HTDATA8_P |
| 3 | PROC0_PCIX0_HTDATA0_N |
| 4 | PROC0_PCIX0_HTDATA8_N |
| 5 | GND |
| 6 | GND |
| 7 | PROC0_PCIX0_HTDATA1_P |
| 8 | PROC0_PCIX0_HTDATA9_P |
| 9 | PROC0_PCIX0_HTDATA1_N |
| 10 | PROC0_PCIX0_HTDATA9_N |
| 11 | GND |
| 12 | GND |
| 13 | PROC0_PCIX0_HTDATA2_P |
| 14 | PROC0_PCIX0_HTDATA10_P |
| 15 | PROC0_PCIX0_HTDATA2_N |
| 16 | PROC0_PCIX0_HTDATA10_N |
| 17 | GND |
| 18 | GND |
| 19 | PROC0_PCIX0_HTDATA3_P |
| 20 | PROC0_PCIX0_HTDATA11_P |
| 21 | PROC0_PCIX0_HTDATA3_N |
| 22 | PROC0_PCIX0_HTDATA11_N |
| 23 | GND |
| 24 | GND |
| 25 | PROC0_PCIX0_HTCLK0_P |
| 26 | PROC0_PCIX0_HTCLK1_P |
| 27 | PROC0_PCIX0_HTCLK0_N |
| 28 | PROC0_PCIX0_HTCLK1_N |
| 29 | GND |
| 30 | GND |
| 31 | PROC0_PCIX0_HTDATA4_P |
| 32 | PROC0_PCIX0_HTDATA12_P |
| 33 | PROC0_PCIX0_HTDATA4_N |
| 34 | PROC0_PCIX0_HTDATA12_N |
| 35 | GND |
| 36 | GND |
| 37 | PROC0_PCIX0_HTDATA5_P |
| 38 | PROC0_PCIX0_HTDATA13_P |
| 39 | PROC0_PCIX0_HTDATA5_N |
| 40 | PROC0_PCIX0_HTDATA13_N |
| 41 | GND |
| 42 | GND |
| 43 | PROC0_PCIX0_HTDATA6_P |
| 44 | PROC0_PCIX0_HTDATA14_P |
| 45 | PROC0_PCIX0_HTDATA6_N |
| 46 | PROC0_PCIX0_HTDATA14_N |
| 47 | GND |
| 48 | GND |
| 49 | PROC0_PCIX0_HTDATA7_P |
| 50 | PROC0_PCIX0_HTDATA15_P |
| 51 | PROC0_PCIX0_HTDATA7_N |
| 52 | PROC0_PCIX0_HTDATA15_N |
| 53 | GND |
| 54 | GND |
| 55 | PROC0_PCIX0_HTCTL_P |
| 56 | NO CONNECT |
| 57 | PROC0_PCIX0_HTCTL_N |
| 58 | NO CONNECT |
| 59 | GND |
| 60 | GND |
| 61 | PCIX0_PROC0_HTCTL_P |
| 62 | NO CONNECT |
| 63 | PCIX0_PROC0_HTCTL_N |
| 64 | NO CONNECT |
| 65 | GND |
| 66 | GND |
| 67 | PCIX0_PROC0_HTDATA7_P |
| 68 | PCIX0_PROC0_HTDATA15_P |
| 69 | PCIX0_PROC0_HTDATA7_N |
| 70 | PCIX0_PROC0_HTDATA15_N |
| 71 | GND |
| 72 | GND |
| 73 | PCIX0_PROC0_HTDATA6_P |
| 74 | PCIX0_PROC0_HTDATA14_P |
| 75 | PCIX0_PROC0_HTDATA6_N |
| 76 | PCIX0_PROC0_HTDATA14_N |
| 77 | GND |
| 78 | GND |
| 79 | PCIX0_PROC0_HTDATA5_P |
| 80 | PCIX0_PROC0_HTDATA13_P |
| 81 | PCIX0_PROC0_HTDATA5_N |
| 82 | PCIX0_PROC0_HTDATA13_N |
| 83 | GND |
| 84 | GND |
| 85 | PCIX0_PROC0_HTDATA4_P |
| 86 | PCIX0_PROC0_HTDATA12_P |
| 87 | PCIX0_PROC0_HTDATA4_N |
| 88 | PCIX0_PROC0_HTDATA12_N |
| 89 | GND |
| 90 | GND |
| 91 | PCIX0_PROC0_HTCLK0_P |
| 92 | PCIX0_PROC0_HTCLK1_P |
| 93 | PCIX0_PROC0_HTCLK0_N |
| 94 | PCIX0_PROC0_HTCLK1_N |
| 95 | GND |
| 96 | GND |
| 97 | PCIX0_PROC0_HTDATA3_P |
| 98 | PCIX0_PROC0_HTDATA11_P |
| 99 | PCIX0_PROC0_HTDATA3_N |
| 100 | PCIX0_PROC0_HTDATA11_N |
| 101 | GND |
| 102 | GND |
| 103 | PCIX0_PROC0_HTDATA2_P |
| 104 | PCIX0_PROC0_HTDATA10_P |
| 105 | PCIX0_PROC0_HTDATA2_N |
| 106 | PCIX0_PROC0_HTDATA10_N |
| 107 | GND |
| 108 | GND |
| 109 | PCIX0_PROC0_HTDATA1_P |
| 110 | PCIX0_PROC0_HTDATA9_P |
| 111 | PCIX0_PROC0_HTDATA1_N |
| 112 | PCIX0_PROC0_HTDATA9_N |
| 113 | GND |
| 114 | GND |
| 115 | PCIX0_PROC0_HTDATA0_P |
| 116 | PCIX0_PROC0_HTDATA8_P |
| 117 | PCIX0_PROC0_HTDATA0_N |
| 118 | PCIX0_PROC0_HTDATA8_N |
| 119 | GND |
| 120 | GND |

TABLE 7

I/O Card to Processor Card Mezzanine Connector Pin-out

| Pin # | Pin Name |
|---|---|
| 1 | PROC0_PCIX2_HTCTL_N |
| 2 | NO CONNECT |
| 3 | PROC0_PCIX2_HTCTL_P |
| 4 | NO CONNECT |
| 5 | GND |
| 6 | GND |
| 7 | PROC0_PCIX2_HTDATA7_N |
| 8 | PROC0_PCIX2_HTDATA15_N |
| 9 | PROC0_PCIX2_HTDATA7_P |
| 10 | PROC0_PCIX2_HTDATA15_P |
| 11 | GND |
| 12 | GND |
| 13 | PROC0_PCIX2_HTDATA6_N |
| 14 | PROC0_PCIX2_HTDATA14_N |
| 15 | PROC0_PCIX2_HTDATA6_P |

TABLE 7-continued

I/O Card to Processor Card Mezzanine Connector Pin-out

| Pin # | Pin Name |
|---|---|
| 16 | PROC0_PCIX2_HTDATA14_P |
| 17 | GND |
| 18 | GND |
| 19 | PROC0_PCIX2_HTDATA5_N |
| 20 | PROC0_PCIX2_HTDATA13_N |
| 21 | PROC0_PCIX2_HTDATA5_P |
| 22 | PROC0_PCIX2_HTDATA13_P |
| 23 | GND |
| 24 | GND |
| 25 | PROC0_PCIX2_HTDATA4_N |
| 26 | PROC0_PCIX2_HTDATA12_N |
| 27 | PROC0_PCIX2_HTDATA4_P |
| 28 | PROC0_PCIX2_HTDATA12_P |
| 29 | GND |
| 30 | GND |
| 31 | PROC0_PCIX2_HTCLK0_N |
| 32 | PROC0_PCIX2_HTCLK1_N |
| 33 | PROC0_PCIX2_HTCLK0_P |
| 34 | PROC0_PCIX2_HTCLK1_P |
| 35 | GND |
| 36 | GND |
| 37 | PROC0_PCIX2_HTDATA3_N |
| 38 | PROC0_PCIX2_HTDATA11_N |
| 39 | PROC0_PCIX2_HTDATA3_P |
| 40 | PROC0_PCIX2_HTDATA11_P |
| 41 | GND |
| 42 | GND |
| 43 | PROC0_PCIX2_HTDATA2_N |
| 44 | PROC0_PCIX2_HTDATA10_N |
| 45 | PROC0_PCIX2_HTDATA2_P |
| 46 | PROC0_PCIX2_HTDATA10_P |
| 47 | GND |
| 48 | GND |
| 49 | PROC0_PCIX2_HTDATA1_N |
| 50 | PROC0_PCIX2_HTDATA9_N |
| 51 | PROC0_PCIX2_HTDATA1_P |
| 52 | PROC0_PCIX2_HTDATA9_P |
| 53 | GND |
| 54 | GND |
| 55 | PROC0_PCIX2_HTDATA0_N |
| 56 | PROC0_PCIX2_HTDATA8_P |
| 57 | PROC0_PCIX2_HTDATA0_P |
| 58 | PROC0_PCIX2_HTDATA8_N |
| 59 | GND |
| 60 | GND |
| 61 | PCIX2_PROC0_HTDATA0_N |
| 62 | PCIX2_PROC0_HTDATA8_N |
| 63 | PCIX2_PROC0_HTDATA0_P |
| 64 | PCIX2_PROC0_HTDATA8_P |
| 65 | GND |
| 66 | GND |
| 67 | PCIX2_PROC0_HTDATA1_N |
| 68 | PCIX2_PROC0_HTDATA9_N |
| 69 | PCIX2_PROC0_HTDATA1_P |
| 70 | PCIX2_PROC0_HTDATA9_P |
| 71 | GND |
| 72 | GND |
| 73 | PCIX2_PROC0_HTDATA2_N |
| 74 | PCIX2_PROC0_HTDATA10_N |
| 75 | PCIX2_PROC0_HTDATA2_P |
| 76 | PCIX2_PROC0_HTDATA10_P |
| 77 | GND |
| 78 | GND |
| 79 | PCIX2_PROC0_HTDATA3_N |
| 80 | PCIX2_PROC0_HTDATA11_N |
| 81 | PCIX2_PROC0_HTDATA3_P |
| 82 | PCIX2_PROC0_HTDATA11_P |
| 83 | GND |
| 84 | GND |
| 85 | PCIX2_PROC0_HTCLK0_N |
| 86 | PCIX2_PROC0_HTCLK1_N |
| 87 | PCIX2_PROC0_HTCLK0_P |
| 88 | PCIX2_PROC0_HTCLK1_P |
| 89 | GND |
| 90 | GND |
| 91 | PCIX2_PROC0_HTDATA4_N |
| 92 | PCIX2_PROC0_HTDATA12_N |
| 93 | PCIX2_PROC0_HTDATA4_P |
| 94 | PCIX2_PROC0_HTDATA12_P |
| 95 | GND |
| 96 | GND |
| 97 | PCIX2_PROC0_HTDATA5_N |
| 98 | PCIX2_RROC0_HTDATA13_N |
| 99 | PCIX2_PROC0_HTDATA5_P |
| 100 | PCIX2_PROC0_HTDATA13_P |
| 101 | GND |
| 102 | GND |
| 103 | PCIX2_PROC0_HTDATA6_N |
| 104 | PCIX2_PROC0_HTDATA14_N |
| 105 | PCIX2_PROC0_HTDATA6_P |
| 106 | PCIX2_PROC0_HTDATA14_P |
| 107 | GND |
| 108 | GND |
| 109 | PCIX2_PROC0_HTDATA7_N |
| 110 | PCIX2_PROC0_HTDATA15_N |
| 111 | PCIX2_PROC0_HTDATA7_N |
| 112 | PCIX2_PROC0_HTDATA15_P |
| 113 | GND |
| 114 | GND |
| 115 | PCIX2_PROC0_HTCTL_N |
| 116 | NO CONNECT |
| 117 | PCIX2_PROC0_HTCTL_P |
| 118 | NO CONNECT |
| 119 | GND |
| 120 | GND |
| 121 | P12 V |
| 122 | P12 V |
| 123 | P12 V |
| 124 | P12 V |
| 125 | P12 V |
| 126 | P12 V |
| 127 | P12 V |
| 128 | P12 V |
| 129 | P12 V |
| 130 | P12 V |
| 131 | P12 V |
| 132 | P12 V |
| 133 | P12 V |
| 134 | P12 V |
| 135 | P12 V |
| 136 | P12 V |
| 137 | P12 V |
| 138 | P12 V |
| 139 | P12 V |
| 140 | P12 V |
| 141 | P12 V |
| 142 | P12 V |
| 143 | P12 V |
| 144 | P12 V |
| 145 | P12 V |
| 146 | P1_2 V |
| 147 | P12 V |
| 148 | P1_2 V |
| 149 | P12 V |
| 150 | P1_2 V |
| 151 | P12 V |
| 152 | P1_2 V |
| 153 | P12 V |
| 154 | P1_2 V |
| 155 | P12 V |
| 156 | P1_2 V |
| 157 | P12 V |
| 158 | P1_2 V |
| 159 | P12 V |
| 160 | P1_2 V |
| 161 | P12 V |
| 162 | P1_2 V |
| 163 | P12 V |
| 164 | P1_2 V |
| 165 | P12 V |

TABLE 7-continued

I/O Card to Processor Card Mezzanine Connector Pin-out

| Pin # | Pin Name |
|---|---|
| 166 | P1_2 V |
| 167 | P12 V |
| 168 | P1_2 V |
| 169 | P12 V |
| 170 | P3_3V |
| 171 | P12 V |
| 172 | P3_3V |
| 173 | P12 V |
| 174 | 3_3 AUX |
| 175 | P12 V |
| 176 | 3_3 AUX |
| 177 | P12 V |
| 178 | 3_3 AUX |
| 179 | P12 V |
| 180 | 3_3 AUX |

TABLE 8

I/O Card to Processor Card Mezzanine Connector Pin-out

| Pin # | Pin Name |
|---|---|
| 1 | PCIX3_PROC1_HTDATA0_P |
| 2 | PCIX3_PROC1_HTDATA8_P |
| 3 | PCIX3_PROC1_HTDATA0_N |
| 4 | PCIX3_PROC1_HTDATA8_N |
| 5 | GND |
| 6 | GND |
| 7 | PCIX3_PROC1_HTDATA1_P |
| 8 | PCIX3_PROC1_HTDATA9_P |
| 9 | PCIX3_PROC1_HTDATA1_N |
| 10 | PCIX3_PROC1_HTDATA9_N |
| 11 | GND |
| 12 | GND |
| 13 | PCIX3_PROC1_HTDATA2_P |
| 14 | PCIX3_PROC1_HTDATA10_P |
| 15 | PCIX3_PROC1_HTDATA2_N |
| 16 | PCIX3_PROC1_HTDATA10_N |
| 17 | GND |
| 18 | GND |
| 19 | PCIX3_PROC1_HTDATA3_P |
| 20 | PCIX3_PROC1_HTDATA11_P |
| 21 | PCIX3_PROC1_HTDATA3_N |
| 22 | PCIX3_PROC1_HTDATA11_N |
| 23 | GND |
| 24 | GND |
| 25 | PCIX3_PROC1_HTCLK0_P |
| 26 | PCIX3_PROC1_HTCLK1_P |
| 27 | PCIX3_PROC1_HTCLK0_N |
| 28 | PCIX3_PROC1_HTCLK1_N |
| 29 | GND |
| 30 | GND |
| 31 | PCIX3_PROC1_HTDATA4_P |
| 32 | PCIX3_PROC1_HTDATA12_P |
| 33 | PCIX3_PROC1_HTDATA4_N |
| 34 | PCIX3_PROC1_HTDATA12_N |
| 35 | GND |
| 36 | GND |
| 37 | PCIX3_PROC1_HTDATA5_P |
| 38 | PCIX3_PROC1_HTDATA13_P |
| 39 | PCIX3_PROC1_HTDATA5_N |
| 40 | PCIX3_PROC1_HTDATA13_N |
| 41 | GND |
| 42 | GND |
| 43 | PCIX3_PROC1_HTDATA6_P |
| 44 | PCIX3_PROC1_HTDATA14_P |
| 45 | PCIX3_PROC1_HTDATA6_N |
| 46 | PCIX3_PROC1_HTDATA14_N |
| 47 | GND |
| 48 | GND |
| 49 | PCIX3_PROC1_HTDATA7_P |
| 50 | PCIX3_PROC1_HTDATA15_P |

TABLE 8-continued

I/O Card to Processor Card Mezzanine Connector Pin-out

| Pin # | Pin Name |
|---|---|
| 51 | PCIX3_PROC1_HTDATA7_N |
| 52 | PCIX3_PROC1_HTDATA15_N |
| 53 | GND |
| 54 | GND |
| 55 | PCIX3_PROC1_HTCTL_P |
| 56 | NO CONNECT |
| 57 | PCIX3_PROC1_HTCTL_N |
| 58 | NO CONNECT |
| 59 | GND |
| 60 | GND |
| 61 | PROC1_PCIX3_HTCTL_P |
| 62 | NO CONNECT |
| 63 | PROC1_PCIX3_HTCTL_N |
| 64 | NO CONNECT |
| 65 | GND |
| 66 | GND |
| 67 | PROC1_PCIX3_HTDATA7_P |
| 68 | PROC1_PCIX3_HTDATA15_P |
| 69 | PROC1_PCIX3_HTDATA7_N |
| 70 | PROC1_PCIX3_HTDATA15_N |
| 71 | GND |
| 72 | GND |
| 73 | PROC1_PCIX3_HTDATA6_P |
| 74 | PROC1_PCIX3_HTDATA14_P |
| 75 | PROC1_PCIX3_HTDATA6_N |
| 76 | PROC1_PCIX3_HTDATA14_N |
| 77 | GND |
| 78 | GND |
| 79 | PROC1_PCIX3_HTDATA5_P |
| 80 | PROC1_PCIX3_HTDATA13_P |
| 81 | PROC1_PCIX3_HTDATA5_N |
| 82 | PROC1_PCIX3_HTDATA13_N |
| 83 | GND |
| 84 | GND |
| 85 | PROC1_PCIX3_HTDATA4_P |
| 86 | PROC1_PCIX3_HTDATA12_P |
| 87 | PROC1_PCIX3_HTDATA4_N |
| 88 | PROC1_PCIX3_HTDATA12_N |
| 89 | GND |
| 90 | GND |
| 91 | PROC1_PCIX3_HTCLK0_P |
| 92 | PROC1_PCIX3_HTCLK1_P |
| 93 | PROC1_PCIX3_HTCLK0_N |
| 94 | PROC1_PCIX3_HTCLK1_N |
| 95 | GND |
| 96 | GND |
| 97 | PROC1_PCIX3_HTDATA3_P |
| 98 | PROC1_PCIX3_HTDATA11_P |
| 99 | PROC1_PCIX3_HTDATA3_N |
| 100 | PROC1_PCIX3_HTDATA11_N |
| 101 | GND |
| 102 | GND |
| 103 | PROC1_PCIX3_HTDATA2_P |
| 104 | PROC1_PCIX3_HTDATA10_P |
| 105 | PROC1_PCIX3_HTDATA2_N |
| 106 | PROC1_PCIX3_HTDATA10_N |
| 107 | GND |
| 108 | GND |
| 109 | PROC1_PCIX3_HTDATA1_P |
| 110 | PROC1_PCIX3_HTDATA9_P |
| 111 | PROC1_PCIX3_HTDATA1_N |
| 112 | PROC1_PCIX3_HTDATA9_N |
| 113 | GND |
| 114 | GND |
| 115 | PROC1_PCIX3_HTDATA0_P |
| 116 | PROC1_PCIX3_HTDATA8_P |
| 117 | PROC1_PCIX3_HTDATA0_N |
| 118 | PROC1_PCIX3_HTDATA8_N |
| 119 | GND |
| 120 | GND |

TABLE 9

I/O Card to Processor Card Mezzanine Connector Pin-out

| Pin # | Pin Name |
|---|---|
| 1 | PCIX1_PROC1_HTCTL_N |
| 2 | NO CONNECT |
| 3 | PCIX1_PROC1_HTCTL_P |
| 4 | NO CONNECT |
| 5 | GND |
| 6 | GND |
| 7 | PCIX1_PROC1_HTDATA7_N |
| 8 | PCIX1_PROC1_HTDATA15_N |
| 9 | PCIX1_PROC1_HTDATA7_P |
| 10 | PCIX1_PROC1_HTDATA15_P |
| 11 | GND |
| 12 | GND |
| 13 | PCIX1_PROC1_HTDATA6_N |
| 14 | PCIX1_PROC1_HTDATA14_N |
| 15 | PCIX1_PROC1_HTDATA6_P |
| 16 | PCIX1_PROC1_HTDATA14_P |
| 17 | GND |
| 18 | GND |
| 19 | PCIX1_PROC1_HTDATA5_N |
| 20 | PCIX1_PROC1_HTDATA13_N |
| 21 | PCIX1_PROC1_HTDATA5_P |
| 22 | PCIX1_PROC1_HTDATA13_P |
| 23 | GND |
| 24 | GND |
| 25 | PCIX1_PROC1_HTDATA4_N |
| 26 | PCIX1_PROC1_HTDATA12_N |
| 27 | PCIX1_PROC1_HTDATA4_P |
| 28 | PCIX1_PROC1_HTDATA12_P |
| 29 | GND |
| 30 | GND |
| 31 | PCIX1_PROC1_HTCLK0_N |
| 32 | PCIX1_PROC1_HTCLK1_N |
| 33 | PCIX1_PROC1_HTCLK0_P |
| 34 | PCIX1_PROC1_HTCLK1_P |
| 35 | GND |
| 36 | GND |
| 37 | PCIX1_PROC1_HTDATA3_N |
| 38 | PCIX1_PROC1_HTDATA11_N |
| 39 | PCIX1_PROC1_HTDATA3_P |
| 40 | PCIX1_PROC1_HTDATA11_P |
| 41 | GND |
| 42 | GND |
| 43 | PCIX1_PROC1_HTDATA2_N |
| 44 | PCIX1_PROC1_HTDATA10_N |
| 45 | PCIX1_PROC1_HTDATA2_P |
| 46 | PCIX1_PROC1_HTDATA10_P |
| 47 | GND |
| 48 | GND |
| 49 | PCIX1_PROC1_HTDATA1_N |
| 50 | PCIX1_PROC1_HTDATA9_N |
| 51 | PCIX1_PROC1_HTDATA1_P |
| 52 | PCIX1_PROC1_HTDATA9_P |
| 53 | GND |
| 54 | GND |
| 55 | PCIX1_PROC1_HTDATA0_N |
| 56 | PCIX1_PROC1_HTDATA8_N |
| 57 | PCIX1_PROC1_HTDATA0_P |
| 58 | PCIX1_PROC1_HTDATA8_P |
| 59 | GND |
| 60 | GND |
| 61 | PROC1_PCIX1_HTDATA0_N |
| 62 | PROC1_PCIX1_HTDATA8_N |
| 63 | PROC1_PCIX1_HTDATA0_P |
| 64 | PROC1_PCIX1_HTDATA8_P |
| 65 | GND |
| 66 | GND |
| 67 | PROC1_PCIX1_HTDATA1_N |
| 68 | PROC1_PCIX1_HTDATA9_N |
| 69 | PROC1_PCIX1_HTDATA1_P |
| 70 | PROC1_PCIX1_HTDATA9_P |
| 71 | GND |
| 72 | GND |
| 73 | PROC1_PCIX1_HTDATA2_N |
| 74 | PROC1_PCIX1_HTDATA10_N |
| 75 | PROC1_PCIX1_HTDATA2_P |
| 76 | PROC1_PCIX1_HTDATA10_P |
| 77 | GND |
| 78 | GND |
| 79 | PROC1_PCIX1_HTDATA3_N |
| 80 | PROC1_PCIX1_HTDATA11_N |
| 81 | PROC1_PCIX1_HTDATA3_P |
| 82 | PROC1_PCIX1_HTDATA11_P |
| 83 | GND |
| 84 | GND |
| 85 | PROC1_PCIX1_HTCLK0_N |
| 86 | PROC1_PCIX1_HTCLK1_N |
| 87 | PROC1_PCIX1_HTCLK0_P |
| 88 | PROC1_PCIX1_HTCLK1_P |
| 89 | GND |
| 90 | GND |
| 91 | PROC1_PCIX1_HTDATA4_N |
| 92 | PROC1_PCIX1_HTDATA12_N |
| 93 | PROC1_PCIX1_HTDATA4_P |
| 94 | PROC1_PCIX1_HTDATA12_P |
| 95 | GND |
| 96 | GND |
| 97 | PROC1_PCIX1_HTDATA5_N |
| 98 | PROC1_PCIX1_HTDATA13_N |
| 99 | PROC1_PCIX1_HTDATA5_P |
| 100 | PROC1_PCIX1_HTDATA13_P |
| 101 | GND |
| 102 | GND |
| 103 | PROC1_PCIX1_HTDATA6_N |
| 104 | PROC1_PCIX1_HTDATA14_N |
| 105 | PROC1_PCIX1_HTDATA6_P |
| 106 | PROC1_PCIX1_HTDATA14_P |
| 107 | GND |
| 108 | GND |
| 109 | PROC1_PCIX1_HTDATA7_N |
| 110 | PROC1_PCIX1_HTDATA15_N |
| 111 | PROC1_PCIX1_HTDATA7_P |
| 112 | PROC1_PCIX1_HTDATA15_P |
| 113 | GND |
| 114 | GND |
| 115 | PROC1_PCIX1_HTCTL_N |
| 116 | NO CONNECT |
| 117 | PROC1_PCIX1_HTCTL_P |
| 118 | NO CONNECT |
| 119 | GND |
| 120 | GND |
| 121 | PROC0_I2C_CLK |
| 122 | THERM_L |
| 123 | PROC0_I2C_DAT |
| 124 | SYSMON_INT_L |
| 125 | GND |
| 126 | GND |
| 127 | PROC1_I2C_CLK |
| 128 | P0_CORE_POWERGOOD |
| 129 | PROC1_I2C_DAT |
| 130 | P1_CORE_POWERGOOD |
| 131 | GND |
| 132 | GND |
| 133 | SP_I2C_CLK |
| 134 | THERMTRIP_L |
| 135 | SP_I2C_DAT |
| 136 | SP HDT_ENABLE_L |
| 137 | GND |
| 138 | GND |
| 139 | PROC0_PRESENT |
| 140 | DDR_A_POWERGOOD_L |
| 141 | PROC1_PRESENT |
| 142 | DDR_B_POWERGOOD_L |
| 143 | HDT_LDTRST_L |
| 144 | GND |
| 145 | PROC0_LDTRST_L |
| 146 | PROC1_LDTRST_L |
| 147 | PROC0_LDTSTOP_L |
| 148 | PROC1_LDTSTOP_L |
| 149 | GND |
| 150 | GND |

TABLE 9-continued

I/O Card to Processor Card Mezzanine Connector Pin-out

| Pin # | Pin Name |
|---|---|
| 151 | PROC_PWROK |
| 152 | PROC0_CORE_ENABLE |
| 153 | SP_HDT_TRST_L |
| 154 | PROC1_CORE_ENABLE |
| 155 | GND |
| 156 | GND |
| 157 | SP_HDT_TCK |
| 158 | DDR_A_ENABLE |
| 159 | SP_HDT_TMS |
| 160 | DDR_B_ENABLE |
| 161 | GND |
| 162 | GND |
| 163 | SP_HDT_TDI |
| 164 | P0_VRM_PRESENT_L |
| 165 | PROC0_PROC1_TDX |
| 166 | P1_VRM_PRESENT_L |
| 167 | GND |
| 168 | GND |
| 169 | SP_PROC0_DBREQ_L |
| 170 | PROC0_DBREQ_P |
| 171 | PROC0_DBRDY |
| 172 | PROC0_CLK_N |
| 173 | GND |
| 174 | GND |
| 175 | V_RTC_BATT |
| 176 | PROC1_CLK_P |
| 177 | MEZZ_SENSE_L |
| 178 | PROC1_CLK_N |
| 179 | GND |
| 180 | GND |

Figure 10:
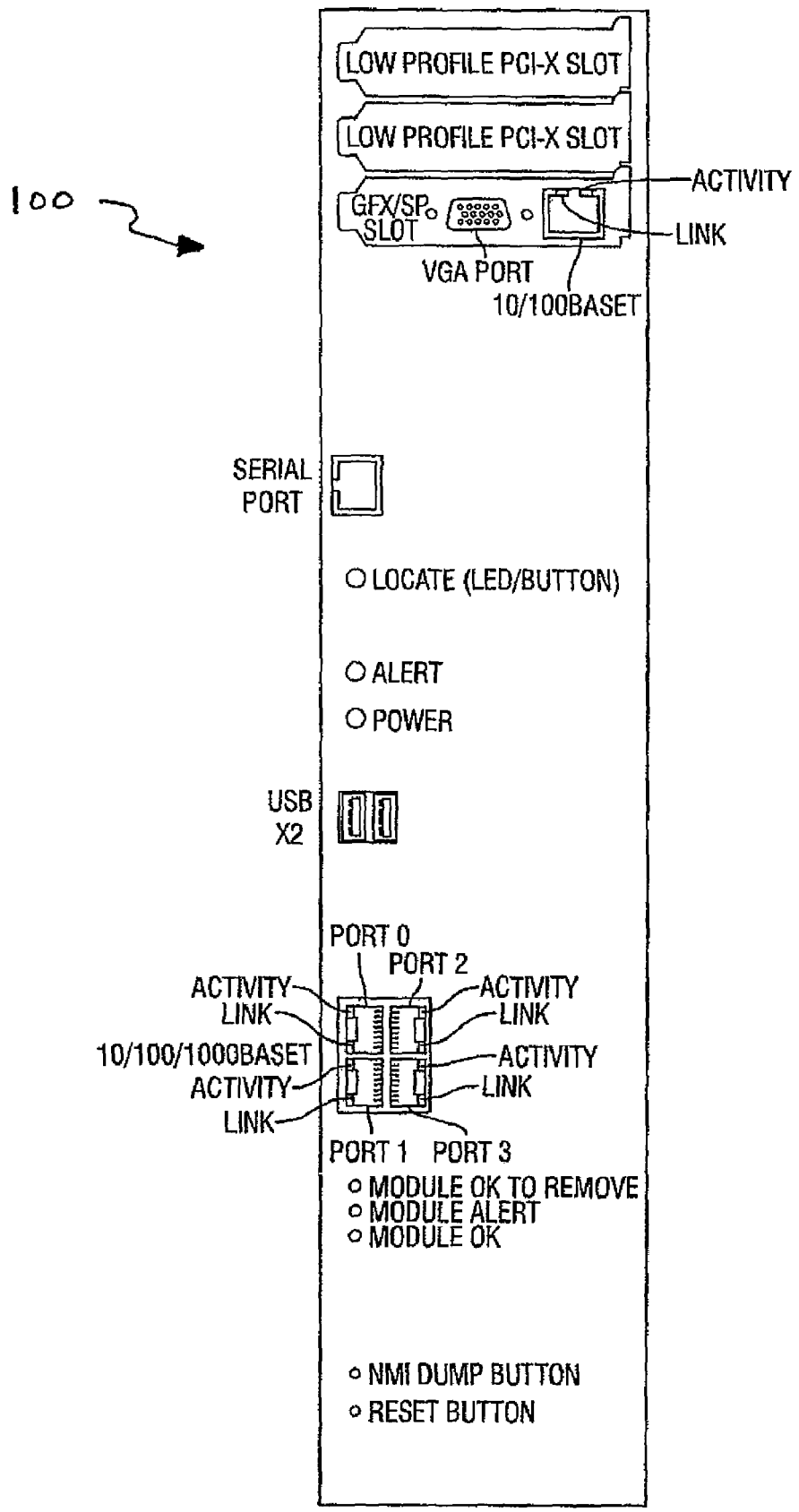
FIG. 10 shows the face plate for the System Controller of an exemplary embodiment of a rackmount storage server.
Figure 11:
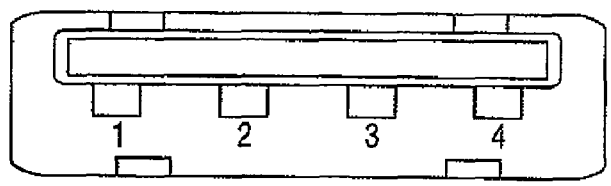
FIG. 11 shows a USB connector.
Figure 12:
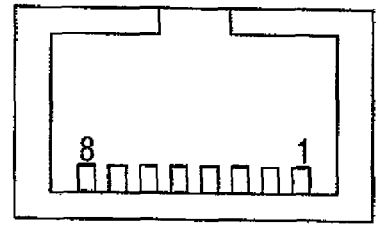
FIG. 12 shows a Serial connector.
Figure 13:
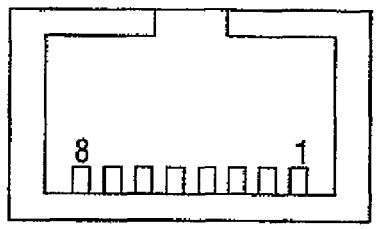
FIG. 13 shows a 10/100BaseT connector.
Figure 14:
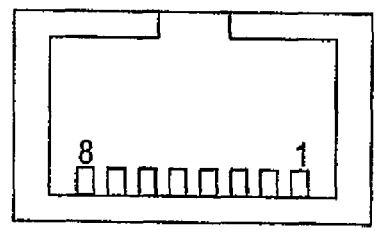
FIG. 14 shows a 10/100/1000BaseT connector.
Figure 15:
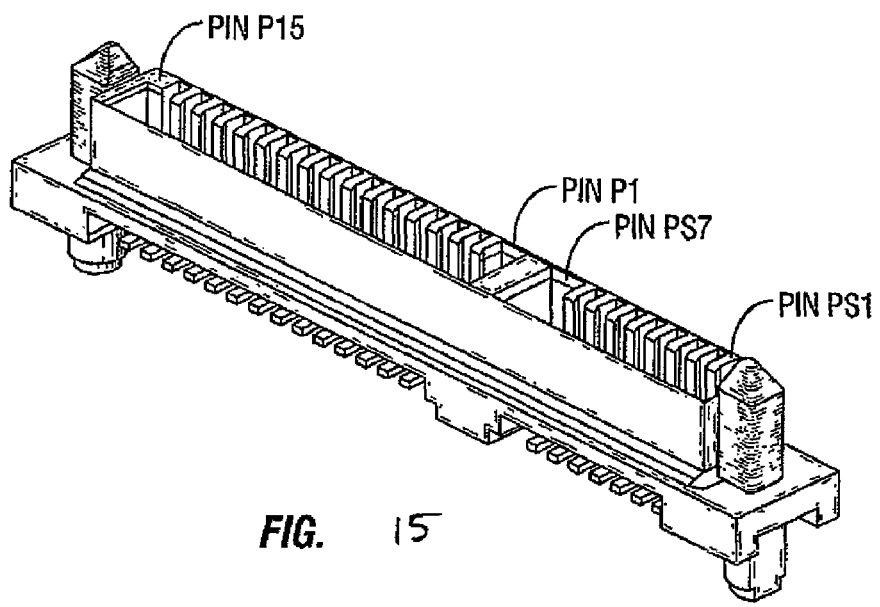
FIG. 15 shows an S-ATA connector.

FIG. 10 shows the face plate 100 for the Controller Assembly. Three printed circuit boards (PCBs) are included in this assembly and all of the other assemblies/field replaceable units plug into these PCBs. The three PCBs are the disk backplane, the power backplane, and the indicator board. The disk backplane connects to the System Controller Assembly, the hard drives, and the fan trays. The disk backplane also includes the front USB ports. The power backplane connects to the three power supplies which provide power to the disk backplane. The disk backplane serves as the central point for the chassis. All field replaceable units plug into the disk backplane.

The Power Backplane-to-Disk Backplane Connector Pin-out is set forth below in Table 10. The connector has 10 blades with a 30 A limit per blade. There are 24 signals pins. Five blades are used for 12V, giving a 150 A capability.

TABLE 10

Power Backplane to Disk Backplane Connector Pin-out

| Signal Name | Signal Type | Pin Count |
|---|---|---|
| +12 V | Power | 5 blades |
| I2C (SCL, SDA) | Bi-directional data | 2 |
| Intrusion Detection | Input | 1 |
| Enable | Input | 4 (1 reserved) |
| Fail | Output | 4 (1 reserved) |
| Presence Detect | Input | 4 (1 reserved) |
| Front Panel LEDs | Input | 4 |
| Spare | | 4 |
| Ground | Ground | 5 blades |

The Power Supply Connector Pin-out is set forth below in Table 11.

TABLE 11

Power Supply Output Connector Pin-out

| Pin # | Pin Name | Description |
|---|---|---|
| P1 | 12 V | 12 V Power Output (Blade) |
| P2 | 12 V | 12 V Power Output (Blade) |
| A1 | SCL | EEPROM Serial Clock Input |
| B1 | SDA | EEPROM Serial Data I/O |
| C1 | A0 | EEPROM LSB Address Input |
| D1 | 12VRS | 12 V Remote Sense |
| A2 | A1 | EEPROM Address Bit 1 Input |
| B2 | CS | 12 V Current Share |
| C2 | PF | Power Fail |
| D2 | 12VT | 12 V Test |
| A3 | NC | No Connect |
| B3 | NC | No Connect |
| C3 | NC | No Connect |
| D3 | NC | No Connect |
| A4 | NC | No Connect |
| B4 | NC | No Connect |
| C4 | NC | No Connect |
| D4 | NC | No Connect |
| A5 | NC | No Connect |
| B5 | ID0 | Power Supply ID Bit 0 |
| C5 | ID1 | Power Supply ID Bit 1 |
| D5 | ID2 | Power Supply ID Bit 2 |
| A6 | NC | No Connect |
| B6 | NC | No Connect |
| C6 | PCTL | Power Control (short pin - 0.170") |
| D6 | 12VRRS | 12 V Return Remote Sense |
| 7 | 12VR | Main Power Return (Blade) |
| 8 | 12VR | Main Power Return (Blade) |

The Controller Assembly includes an Inter-IC Communication bus (I2C), which is a 2-pin serial bus used to control some of the basic system management features. The I/O Board and Service Processor include EEPROMs, fan controllers, power supply monitors, etc., which are used to monitor the health and status of the system. In some cases, such as temperature, a separate interrupt immediately alerts the processors in case of a problem.

The CPLD, located on the I/O Board, handles Battery Backup failover. This is done to enable the quickest transition to battery power upon loss of AC power. The CPLD detects the type of unit in each power bay. Power bays 0 and 1 are power supplies. Power bay 2 can either be a power supply or a battery backup unit. The battery backup unit may be, as an example, an uninterruptible power supply (UPS) unit. A battery backup unit is indicated by assertion of the PS2_BATT_L signal (driven low). This signal is connected to Pin D4 of the power supply connectors and is grounded inside the battery backup unit.

When power-on sequence is initiated, the power supplies are enabled and the battery is not enabled. When all power supplies indicate failure, the CPLD will assert the ENABLE signal to the battery. The ENABLE signals going to the power supplies remain asserted. The Service Processor detects the switch to battery power and signals the operating system (OS) to power down after a given interval. During that interval, the CPLD will monitor the PS signals. If a power supply recovers and reasserts its POWEROK signal—either AC power is restored or a new power supply is installed—the CPLD disables the battery.

The Service Processor detects the failover to battery power and notifies the OS. The SP detects the failover to battery power by observing the POWEROK signal of the battery. If this is ever asserted, that means the system has switched to battery power. The SP waits for a given interval to determine whether AC power is restored or if a new power supply is inserted. If the time on battery power exceeds the given interval, the SP signals the OS to start a rapid shutdown.

Also, the SP logs the event. Thus, if too many power failure events occur, the SP can flag a problem. The SP also tracks the amount of time that the battery is powering the system, so that the battery can be replaced at the appropriate time. This information is stored in the EEPROM of the BBU. The OS has a rapid shutdown routine triggered by the SP notification. This shuts the system down within 4 minutes.

Figure 16:
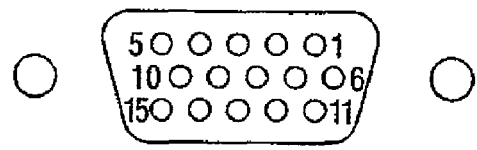
FIG. 16 shows a VGA connector.

Connector pin-outs for various SunFire x4500 system connectors are set forth below. The USB connector is shown in FIG. 16 and the pin-outs are shown below in table 12.

TABLE 12

USB connector pin-out

| Pin # | Pin Name | Description |
|---|---|---|
| 1 | +5 V | +5 V Supply |
| 2 | Data− | Negative side of differential pair for data |
| 3 | Data+ | Positive side of differential pair for data |
| 4 | Gnd | Ground |

The Serial connector is shown in FIG. 17 and the pin-outs are shown below in table 13.

TABLE 13

Serial connector pin-out

| Pin # | Pin Name | Description |
|---|---|---|
| 1 | RTS | Ready To Send |
| 2 | DTR | Data Terminal Ready |
| 3 | TXD | Transmit Data |
| 4 | GND | Ground |
| 5 | GND | Ground |
| 6 | RXD | Receive Data |
| 7 | DSR | Data Set Ready |
| 8 | CTS | Clear To Send |

The 10/100BaseT connector is shown in FIG. 18 and the pin-outs are shown below in table 14.

TABLE 14

1/100BaseT Connector pin-out

| Pin # | Pin Name | Description |
|---|---|---|
| 1 | TX+ | Positive Side of Transmit Data |
| 2 | TX− | Negative Side of Transmit Data |
| 3 | RX+ | Positive Side of Receive Data |
| 4 | NC | No Connect |
| 5 | NC | No Connect |
| 6 | RX− | Negative Side of Receive Data |
| 7 | NC | No Connect |
| 8 | NC | No Connect |

The 10/100/1000BaseT connector is shown in FIG. 19 and the pin-outs are shown below in table 15.

TABLE 15

10/100/1000BaseT Connector pin-out

| Pin # | Pin Name | Description |
|---|---|---|
| 1 | TP0+ | Positive Side of Data Pair 0 |
| 2 | TP0− | Negative Side of Data Pair 0 |
| 3 | TP1+ | Positive Side of Data Pair 1 |
| 4 | TP2+ | Positive Side of Data Pair 2 |

TABLE 15-continued

10/100/1000BaseT Connector pin-out

| Pin # | Pin Name | Description |
|---|---|---|
| 5 | TP2− | Negative Side of Data Pair 2 |
| 6 | TP1− | Negative Side of Data Pair 1 |
| 7 | TP3+ | Positive Side of Data Pair 3 |
| 8 | TP3− | Negative Side of Data Pair 3 |

The S-ATA connector is shown in FIG. 20 and the pin-outs are shown below in table 16.

TABLE 16

S-ATA connector pin-out
Pin-out Table

Signal Segment Key

| | | | |
|---|---|---|---|
| Signal Segment | S1 | Gnd | $2^{nd}$ mate |
| | S2 | TX+ | Transmit from PHY to hard drive |
| | S3 | TX− | |
| | S4 | Gnd | $2^{nd}$ mate |
| | S5 | RX− | Receive from hard drive to PHY |
| | S6 | RX+ | |
| | S7 | Gnd | $2^{nd}$ mate |

Signal Segment "L"
Central Connector Polarizer
Power Segment "L"

| | | | |
|---|---|---|---|
| Power Segment | P1 | 3.3 V | Not Supported |
| | P2 | 3.3 V | Not Supported |
| | P3 | 3.3 V | Not Supported |
| | P4 | Gnd | $1^{st}$ mate |
| | P5 | Gnd | $2^{nd}$ mate |
| | P6 | Gnd | $2^{nd}$ mate |
| | P7 | 5.0 V | Pre-charge, $2^{nd}$ mate |
| | P8 | 5.0 V | |
| | P9 | 5.0 V | |
| | P10 | Gnd | $2^{nd}$ mate |
| | P11 | Reserved | No connect |
| | P12 | Gnd | $1^{st}$ mate |
| | P13 | 12.0 V | Pre-charge, $2^{nd}$ mate |
| | P14 | 12.0 V | |
| | P15 | 12.0 V | |

Power Segment Key

The VGA connector is shown in FIG. 21 and the pin-outs are shown below in table 17.

TABLE 17

VGA connector pin-out

| Pin # | Pin Name | Description |
|---|---|---|
| 1 | RED | Red Video |
| 2 | GRN | Green Video |
| 3 | BLU | Blue Video |
| 4 | NC | No Connect |
| 5 | GND | Ground |
| 6 | R_GND | Red Video Return (Ground) |
| 7 | G_GND | Green Video Return (Ground) |
| 8 | B_GND | Blue Video Return (Ground) |
| 9 | KEY | No Pin |
| 10 | S_GND | Sync Return (Ground) |
| 11 | NC | No Connect |
| 12 | ID1 | Monitor ID1 |
| 13 | HSYNC | Horizontal Sync |
| 14 | VSYNC | Vertical Sync |
| 15 | ID2 | Monitor ID2 |

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A server, comprising:
a printed circuit board (PCB) disposed along an inside surface of the server, the PCB having a plurality of connectors adapted to be connected to a plurality of top-loading storage devices;
a controller assembly operatively connected to the PCB;
a plurality of redundant cooling units disposed along a first side portion of the server; and
an integrated battery arranged to store power for saving data in a main memory to at least one of the plurality of top-loading storage devices,
wherein the controller assembly includes at least one PCI expansion slot,
wherein the controller assembly is configured to detect failure of any one of the plurality of redundant cooling units, generate a corresponding failure indication, and illuminate a cooling unit failure LED, and
wherein the controller assembly is configured to generate an alert if more than a predetermined number of power failure events occur and track an amount of time that the integrated battery is powering the server.

2. The server of claim 1, wherein the controller assembly is operatively connected to the PCB from a rear side of the PCB.

3. The server of claim 1, wherein the PCB is a backplane.

4. The server of claim 3, wherein the backplane is disposed along an inside bottom surface of the server.

5. The server of claim 1, wherein the plurality of top-loading storage devices comprises 48 hard disks.

6. The server of claim 5, wherein the 48 hard disks are disposable in a 12×4 arrangement.

7. The server of claim 1, wherein the controller assembly comprises a general purpose architecture capable of running at least one general purpose application.

8. The server of claim 1, wherein the at least one PCI expansion slot is one of a PCI-X expansion slot and a PCI-Express expansion slot.

9. The server of claim 1, wherein at least one of the plurality of redundant cooling units is arranged to direct air into the server.

10. The server of claim 1, wherein the plurality of redundant cooling units comprises two rows of fans.

11. An apparatus, comprising:
a chassis;
a printed circuit board (PCB) having a first connector connectable to a second connector integral with a storage device insertable from a top portion of the chassis;
a controller assembly operatively connectable to a rear side of the PCB, the controller assembly being accessible from a rear side of the chassis;
a plurality of rows of cooling units disposed along a front portion of the chassis;
a disk carrier arranged to at least partially house the storage device; and
a battery backup unit operatively connected in an interior region of the chassis,
wherein the controller assembly includes at least one PCI expansion slot,
wherein the controller assembly is configured to detect failure of any one of the plurality of redundant cooling units, generate a corresponding failure indication, and illuminate a cooling unit failure LED, and
wherein the controller assembly is configured to generate an alert if more than a predetermined number of power failure events occur and track an amount of time that the integrated battery is powering the server.

12. The apparatus of claim 11, wherein the PCB is operatively connectable to 48 storage devices.

13. The apparatus of claim 12, wherein the 48 storage devices are operatively connectable to the PCB in a 12×4 configuration.

14. The apparatus of claim 11, wherein the controller assembly comprises a general purpose architecture capable of running at least one general purpose application.

15. The apparatus of claim 11, wherein the at least one PCI expansion slot is one of a PCI-X expansion slot and a PCI-Express expansion slot.

16. The apparatus of claim 11, wherein the controller assembly includes a CPU board assembly.

17. The apparatus of claim 11, wherein at least one of the plurality of rows of cooling units is arranged to direct air into the chassis.

18. The apparatus of claim 11, wherein the storage device is one of a SATA disk and a SAS disk.

19. The apparatus of claim 11, wherein the battery backup unit is an uninterruptible power supply.

20. A rackmount storage server, comprising:
a backplane;
top-loading hard disks each having a native connector pluggable into the backplane;
a controller assembly operatively connected to the backplane from a rear side of the backplane;
redundant fan units disposed along a front portion of the rackmount storage server and arranged to direct air into the rackmount storage server; and
an integrated UPS battery arranged to store power for saving data from a main memory to at least one of the top-loading hard disks,
wherein the controller assembly includes one of a PCI-X expansion slot and a PCI-Express expansion slot,
wherein the controller assembly is configured to detect failure of any one of the plurality of redundant cooling units, generate a corresponding failure indication, and illuminate a cooling unit failure LED, and
wherein the controller assembly is configured to generate an alert if more than a predetermined number of power failure events occur and track an amount of time that the integrated battery is powering the server.

21. The rackmount storage server of claim 20, wherein the backplane is a passive backplane.

22. The rackmount storage server of claim 20, wherein the top-loading hard disks are arranged in the rackmount storage server in 4 rows of 12 disks each.

23. The rackmount storage server of claim 20, wherein the controller assembly comprises a general purpose server architecture arranged to run at least one general purpose application.

24. The rackmount storage server of claim 20, wherein at least one of the top-loading hard disks comprises one of a SATA disk and a SAS disk.

* * * * *